United States Patent
Yamamoto et al.

(10) Patent No.: US 8,810,558 B2
(45) Date of Patent: *Aug. 19, 2014

(54) DISPLAY DEVICE AND ELECTRONIC APPARATUS

(75) Inventors: Tetsuro Yamamoto, Kanagawa (JP); Junichi Yamashita, Tokyo (JP); Seiichiro Jinta, Aichi (JP); Hideki Sugimoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 281 days.

This patent is subject to a terminal disclaimer.

(21) Appl. No.: 13/428,513

(22) Filed: Mar. 23, 2012

(65) Prior Publication Data

US 2012/0182281 A1    Jul. 19, 2012

Related U.S. Application Data

(63) Continuation of application No. 12/461,278, filed on Aug. 6, 2009, now Pat. No. 8,169,432.

(30) Foreign Application Priority Data

Aug. 8, 2008  (JP) ................................. 2008-204940

(51) Int. Cl.
  *G09G 5/00* (2006.01)
(52) U.S. Cl.
  USPC .............................. 345/212; 345/76; 345/214
(58) Field of Classification Search
  CPC ..... G09G 3/30; G09G 3/3233; G09G 3/3241; G09G 3/325; G09G 2300/08; G09G 2300/0852
  USPC ........................ 345/76–83, 90–100, 204–215; 315/169.1–169.4
  See application file for complete search history.

(56) References Cited

U.S. PATENT DOCUMENTS

| 6,356,026 | B1 | 3/2002 | Murto |
| 6,693,388 | B2 | 2/2004 | Oomura |
| 8,169,432 | B2 * | 5/2012 | Yamamoto et al. ........... 345/214 |

FOREIGN PATENT DOCUMENTS

| JP | 06-317812 A | 11/1994 |
| JP | 11-249632 A | 9/1999 |
| JP | 2001-343911 A | 12/2001 |
| JP | 2004-126139 A | 4/2004 |
| JP | 2007-005766 A | 1/2007 |
| JP | 2007-256881 A | 10/2007 |
| JP | 2007-310311 | 11/2007 |
| JP | 2008-175945 A | 7/2008 |

OTHER PUBLICATIONS

Japanese Office Action issued Jul. 20, 2010 for corresponding Japanese Application No. 2008-204940.

* cited by examiner

*Primary Examiner* — Vijay Shankar
(74) *Attorney, Agent, or Firm* — Rader, Fishman & Grauer PLLC

(57) ABSTRACT

A sampling transistor in embodiments of the present invention is kept at the on-state with a time width shorter than one horizontal cycle, during the period from the rising of a control pulse supplied from a scanner to the falling of the control pulse, and samples a video signal Vsig from a signal line SL to write the video signal Vsig to a hold capacitor. A sampling transistor T1 has a double gate structure in which a pair of transistor elements are connected in common. This suppresses change in the threshold voltage of the sampling transistor.

16 Claims, 23 Drawing Sheets

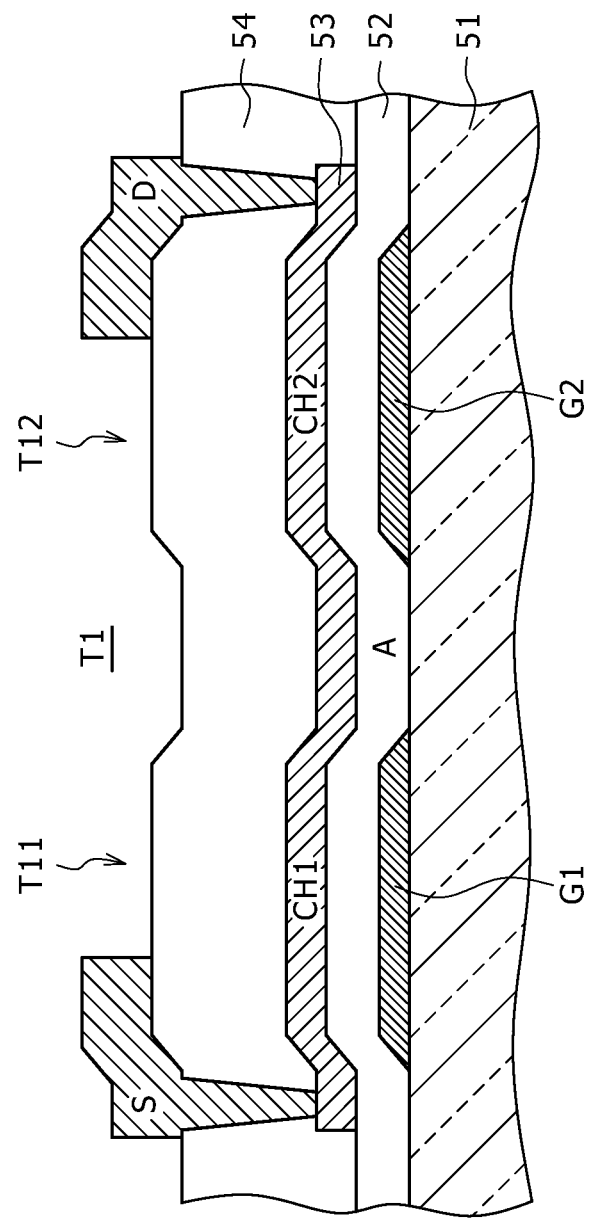

(1)

(2), (3)

(4)

(5)

(6)

(7)

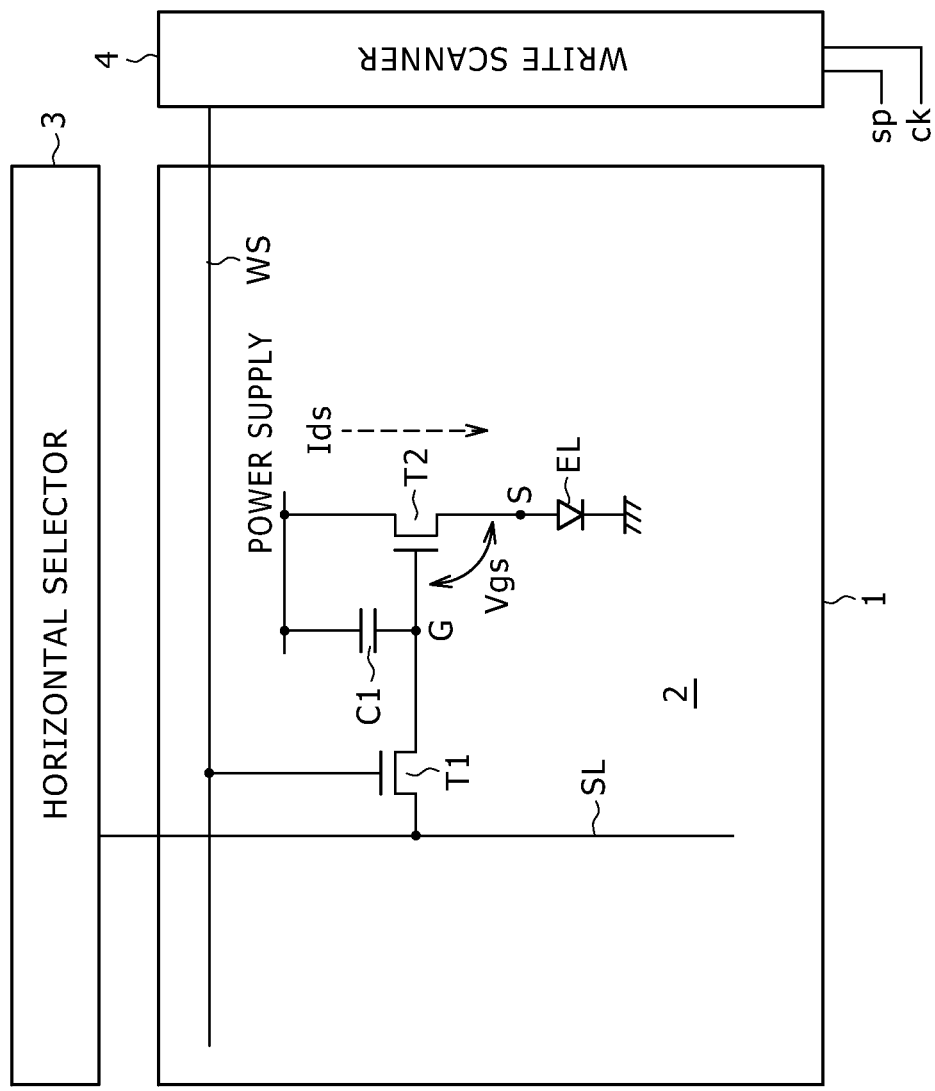

DISPLAY DEVICE AND ELECTRONIC APPARATUS

CROSS REFERENCE TO RELATED APPLICATIONS

This is a Continuation Application of U.S. patent application Ser. No. 12/461,278, filed Aug. 6, 2009, which claims priority from Japanese Application No.: 2008-204940, filed on Aug. 10, 2004 and Japanese Application No.: 2004-244641, filed on Aug. 8, 2008, the entire contents of which are incorporated herein by reference.

BACKGROUND OF THE INVENTION

1. Field of the Invention

The present invention relates to an active-matrix display device including light-emitting elements in its pixels. Furthermore, the present invention relates to electronic apparatus including such a display device. More specifically, the invention relates to a technique for stabilizing the operation of active elements formed in the pixels.

2. Description of the Related Art

In recent years, development of flat self-luminous display devices including organic EL devices as light-emitting elements is being actively promoted. The organic EL device is based on a phenomenon that an organic thin film emits light in response to application of an electric field thereto. The organic EL device can be driven by application voltage of 10 V or lower, and thus has low power consumption. Furthermore, because the organic EL device is a self-luminous element that emits light by itself, it does not need an illuminating unit and thus easily allows reduction in the weight and thickness of the display device. Moreover, the response speed of the organic EL device is as very high as about several microseconds, which causes no image lag in displaying of moving images.

Among the flat self-luminous display devices including the organic EL devices in the pixels, particularly an active-matrix display device in which thin film transistors are integrally formed as drive elements in the respective pixels is being actively developed. The active-matrix flat self-luminous display device is disclosed in e.g. Japanese Patent Laid-open No. 2007-310311.

FIG. 28 is a schematic circuit diagram showing one example of the active-matrix display device of a related art. The display device includes a pixel array part 1 and a peripheral drive part. The drive part includes a horizontal selector 3 and a write scanner 4. The pixel array part 1 includes signal lines SL disposed along the columns and scan lines WS disposed along the rows. Pixels 2 are disposed at the intersections of the signal lines SL and the scan lines WS. FIG. 23 shows only one pixel 2 for easy understanding. The write scanner 4 includes shift registers. The shift registers operate in response to a clock signal ck supplied from the external and sequentially transfer a start pulse sp supplied from the external similarly, to thereby sequentially output a control signal to the scan lines WS. The horizontal selector 3 supplies a video signal to the signal lines SL in matching with the line-sequential scanning by the write scanner 4.

The pixel 2 includes a sampling transistor T1, a drive transistor T2, a hold capacitor C1, and a light-emitting element EL. The drive transistor T2 is a P-channel transistor. The source thereof is connected to a power supply line and the drain thereof is connected to the light-emitting element EL. The gate of the drive transistor T2 is connected to the signal line SL via the sampling transistor T1. The sampling transistor T1 is turned on in response to the control signal supplied from the write scanner 4 to thereby sample the video signal supplied from the signal line SL and write it to the hold capacitor C1. The drive transistor T2 receives, at its gate, the video signal written to the hold capacitor C1 as a gate voltage Vgs, and causes a drain current Ids to flow to the light-emitting element EL. This causes the light-emitting element EL to emit light with the luminance dependent on the video signal. The gate voltage Vgs refers to the potential of the gate relative to that of the source.

The drive transistor T2 operates in the saturation region, and the relationship between the gate voltage Vgs and the drain current Ids is represented by the following characteristic equation.

$$Ids=(½)\mu(W/L)Cox(Vgs-Vth)^2$$

In this equation, $\mu$ denotes the mobility of the drive transistor, W denotes the channel width of the drive transistor, L denotes the channel length of the drive transistor, Cox denotes the capacitance of the gate insulating film of the drive transistor per unit area, and Vth denotes the threshold voltage of the drive transistor. As is apparent from this characteristic equation, when operating in the saturation region, the drive transistor T2 functions as a constant current source that supplies the drain current Ids depending on the gate voltage Vgs.

FIG. 29 is a graph showing the voltage-current characteristic of the light-emitting element EL. In this graph, an anode voltage V is plotted on the abscissa and the drive current Ids is plotted on the ordinate. The anode voltage of the light-emitting element EL is equivalent to the drain voltage of the drive transistor T2. The light-emitting element EL has a tendency that its current-voltage characteristic changes over time and the characteristic curve gradually falls down with time elapse. Therefore, the anode voltage (drain voltage) V changes even if the drive current Ids is constant. However, in the pixel circuit 2 shown in FIG. 25, the drive transistor T2 operates in the saturation region and allows the flowing of the drive current Ids dependent on the gate voltage Vgs irrespective of change in the drain voltage. This makes it possible to keep the light-emission luminance constant irrespective of aging change in the characteristic of the light-emitting element EL.

FIG. 30 is a circuit diagram showing another example of a related-art pixel circuit. This pixel circuit is different from the pixel circuit shown in FIG. 25 in that the drive transistor T2 is not a P-channel transistor but an N-channel transistor. In many cases, it is more advantageous that all of the transistors included in the pixel are N-channel transistors in terms of the circuit manufacturing process.

SUMMARY OF THE INVENTION

The display device of the related art is basically composed of a pixel array part and a drive part for driving the pixel array part. The pixel array part includes scan lines disposed along the rows, signal lines disposed along the columns, and pixels that are disposed at the intersections of the scan lines and the signal lines and thus are arranged in a matrix. The drive part includes a control scanner (write scanner) that sequentially applies a control pulse to the respective scan lines with a predetermined horizontal cycle to thereby line-sequentially scan the pixels on a row-by-row basis and a signal selector (horizontal selector) that supplies a video signal to the signal lines disposed along the columns in matching with this line-sequential scanning.

The pixel includes a sampling transistor, a drive transistor, a light-emitting element, and a hold capacitor. The gate of the sampling transistor is connected to the scan line and one of the source and the drain thereof is connected to the signal line. The gate of the drive transistor is connected the other of the source and the drain of the sampling transistor, and one of the source and the drain of the drive transistor is connected to a power supply. The light-emitting element is connected to the other of the source and the drain of the drive transistor. The hold capacitor is connected between the source and the gate of the drive transistor. The sampling transistor is kept at the on-state during the period from the rising of a control pulse supplied from the control scanner to the falling of the control pulse with a time width shorter than one horizontal cycle, and samples a video signal from the signal line to write it to the hold capacitor. Hereinafter, the width of the time during which the sampling transistor is in the on-state will be often referred to as the signal writing time in the present specification. The drive transistor causes a drive current dependent on the video signal written to the hold capacitor to flow to the light-emitting element. The light-emitting element emits light with the luminance dependent on the drive current. The signal writing time, during which the sampling transistor is in the on-state, is shorter than one horizontal period. If the number of scan lines (the number of lines) is increased in step with enhancement in the definition of the screen, the horizontal period is also correspondingly shortened. There is a tendency that the signal writing time, during which the sampling transistor is in the on-state, is also shortened as enhancement in the definition of the screen progresses.

The sampling transistor formed in each pixel does not necessarily have constant electric characteristics, but the threshold voltage thereof changes over time. Therefore, the writing time during which the sampling transistor is in the on-state also changes. As the signal writing time becomes shorter, the influence of the change in the signal writing time becomes larger and the change affects the image quality. The change in the signal writing time leads to also change in the drive current supplied to the light-emitting element by the drive transistor, resulting in a problem that the light-emission luminance changes and the image quality is deteriorated.

There is a need for the present invention to provide a display device that can suppress change in the signal writing time. To meet this need, the following configuration is devised. Specifically, according to a mode of the present invention, there is provided a display device basically including a pixel array part and a drive part that drives the pixel array part. The pixel array part includes scan lines disposed along rows, signal lines disposed along columns, and pixels that are disposed at the intersections of the scan lines and the signal lines and are arranged in a matrix. The drive part includes a control scanner that sequentially applies a control pulse to the scan lines with a predetermined horizontal cycle to thereby line-sequentially scan the pixels on a row-by-row basis and a signal selector that supplies a video signal to the signal lines disposed along the columns in matching with the line-sequential scanning. The pixel includes a sampling transistor having a gate connected to the scan line and a source and a drain one of which is connected to the signal line, a drive transistor having a gate connected to the other of the source and the drain of the sampling transistor and a source and a drain one of which is connected to a power supply, a light-emitting element connected to the other of the source and the drain of the drive transistor, and a hold capacitor connected between the source and the gate of the drive transistor. The sampling transistor is kept at the on-state during the period from the rising of a control pulse supplied from the control scanner to the falling of the control pulse with a time width shorter than one horizontal cycle, and samples a video signal from the signal line to write the video signal to the hold capacitor. In addition, the sampling transistor has a double gate structure in which a pair of transistor elements are connected in series between the signal line and the gate of the drive transistor and the gates of the pair of transistor elements are connected in common. The drive transistor causes a drive current dependent on a video signal written to the hold capacitor to flow to the light-emitting element for light emission.

Preferably, in the sampling transistor, a capacitor is formed between the gate of the sampling transistor and an intermediate node that interconnects the pair of transistor elements. The film thickness of an insulating film that forms the capacitor is larger than that of an insulating film between the gates of the pair of transistor elements and channels of the pair of transistor elements. Channel regions of the pair of transistor elements are covered by a metal that is formed on the opposite side to the gates of the pair of transistor elements with the intermediary of channels of the pair of transistor elements and is at the same potential as that of the gates of the pair of transistor elements.

Preferably, the pair of transistor elements are different from each other in the channel length. Specifically, of the pair of transistor elements, the transistor element closer to the signal line has channel length larger than that of the transistor element closer to the gate of the drive transistor. The pair of transistor elements have the same channel width. In the period during which the sampling transistor is kept at the on-state to sample a video signal from the signal line and write the video signal to the hold capacitor, negative feedback of a drive current flowing through the drive transistor to the hold capacitor is carried out to thereby give correction for the mobility of the drive transistor to the video signal written to the hold capacitor.

In the mode of the present invention, the sampling transistor has the double gate structure in which the pair of transistor elements are connected in series between the signal line and the gate of the drive transistor. Due to this feature, change in the threshold voltage of the sampling transistor can be suppressed compared with the case in which the double gate structure is not employed. Using the double gate structure stabilizes the operation characteristics and thus stabilizes the signal writing time, which depends on the width of the time during which the sampling transistor is kept at the on-state. Therefore, the change and lowering of the light-emission luminance do not occur, and therefore the image quality can be maintained.

BRIEF DESCRIPTION OF THE DRAWINGS

FIG. 3 is a schematic sectional view showing the double gate structure of a sampling transistor included in the pixel circuit shown in FIGS. 2A and 2B;

FIG. 30 is a circuit diagram showing another example of the related-art display device.

DETAILED DESCRIPTION OF THE PREFERRED EMBODIMENTS

Figure 1:
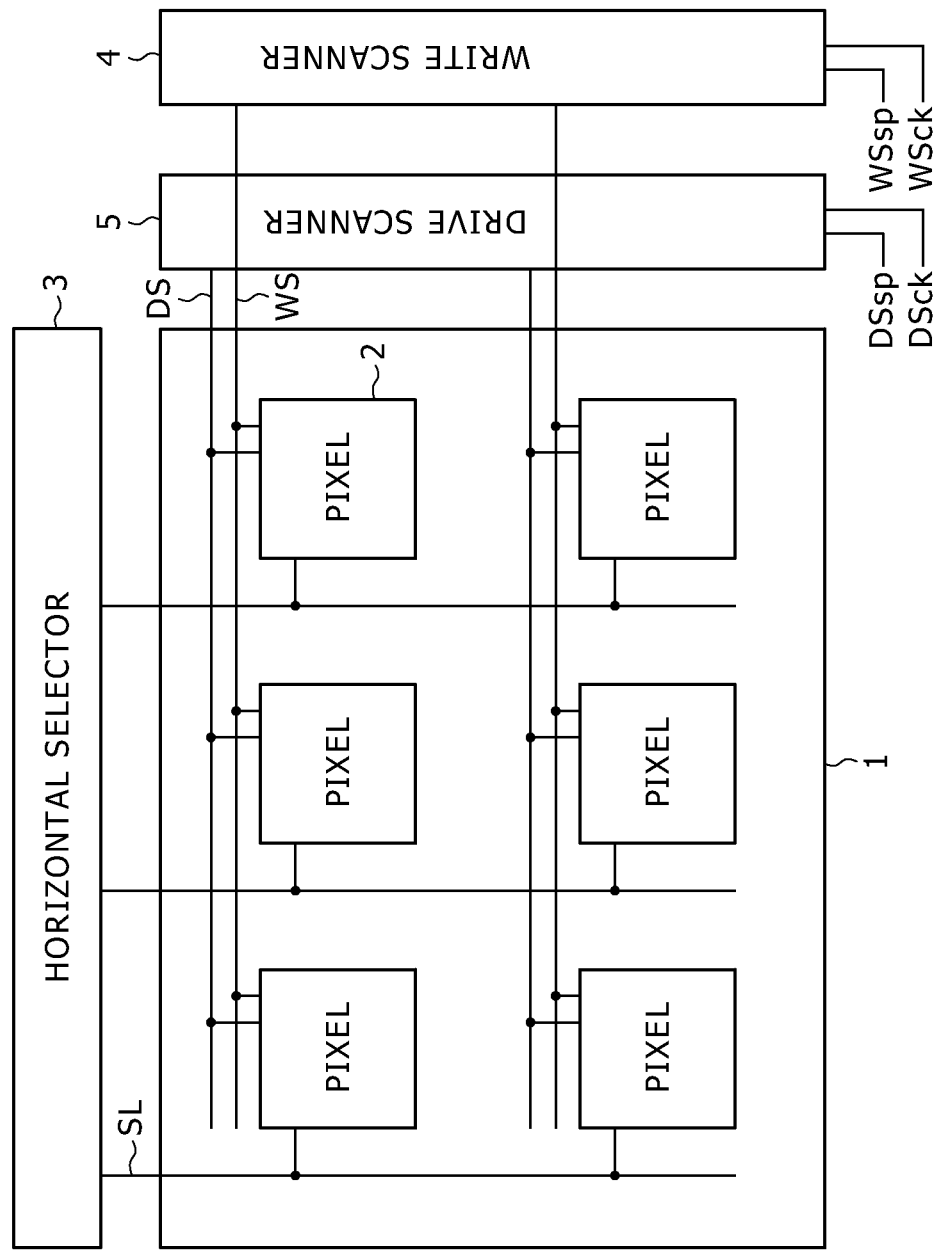
FIG. 1 is a block diagram showing the entire configuration of a display device according to embodiments of the present invention.

Embodiments of the present invention will be described in detail below with reference to the drawings. FIG. 1 is a block diagram showing the entire configuration of a display device according to the embodiments of the present invention. As shown in FIG. 1, this display device includes a pixel array part 1 and a drive part (3, 4, 5) for driving the pixel array part 1. The pixel array part 1 includes scan lines WS along the rows, signal lines SL along the columns, pixels 2 that are disposed at the intersections of both the lines and thus arranged in a matrix, and power feed lines DS disposed corresponding to the respective rows of the pixels 2. The drive part (3, 4, 5) includes a control scanner (write scanner) 4, a power supply scanner (drive scanner) 5, and a signal selector (horizontal selector) 3. The write scanner 4 sequentially supplies a control signal pulse to the respective scan lines WS to thereby line-sequentially scan the pixels 2 on a row-by-row basis. The drive scanner 5 provides a supply voltage that is switched between a first potential and a second potential to the respective power feed lines DS in matching with this line-sequential scanning. The horizontal selector 3 supplies a signal potential and a reference potential as a video signal to the signal lines SL along the columns in matching with this line-sequential scanning. The write scanner 4 operates in response to a clock signal WSck supplied from the external and sequentially transfers a start pulse WSsp supplied from the external similarly, to thereby output the control signal pulse to the respective scan lines WS. The drive scanner 5 operates in response to a clock signal DSck supplied from the external and sequentially transfers a start pulse DSsp supplied from the external similarly, to thereby line-sequentially switch the potentials of the power feed lines DS.

Figure 2A:
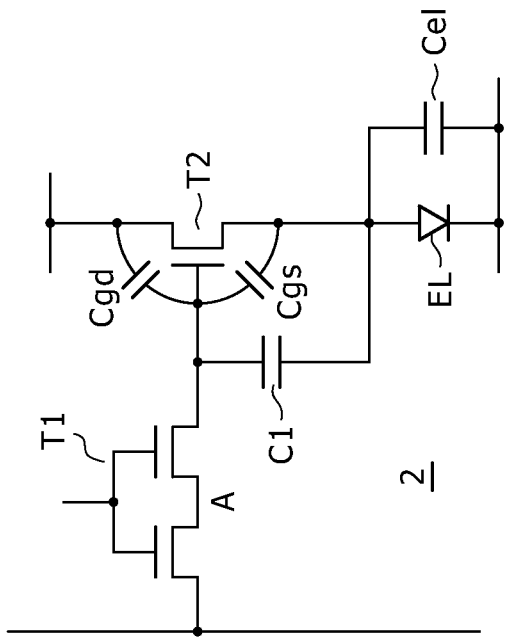
FIGS. 2A and 2B are diagrams showing a pixel circuit in a display device according to a first embodiment of the present invention.
Figure 2B:
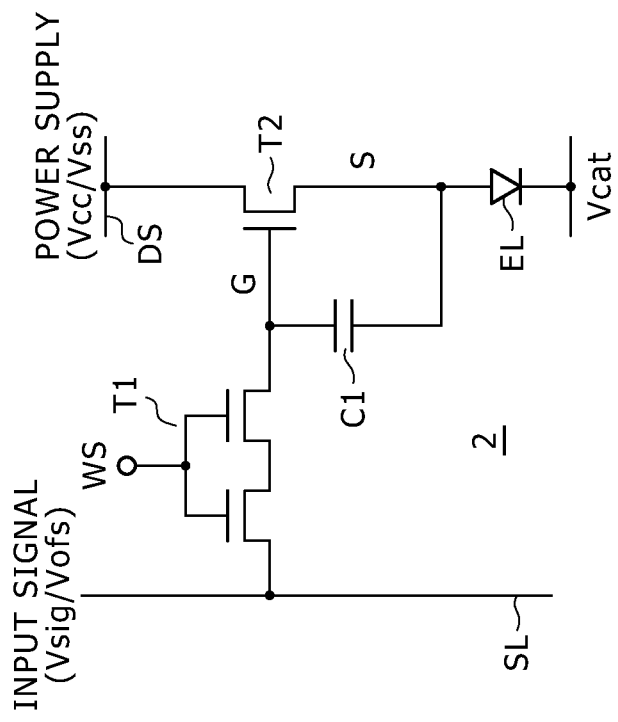

FIGS. 2A and 2B are circuit diagrams showing the specific configuration of the pixel 2 included in the display device shown in FIG. 1. As shown in FIG. 2A, this pixel circuit 2 includes a light-emitting element EL that is a two-terminal element (diode-type element) typified by e.g. an organic EL device, an N-channel sampling transistor T1, an N-channel drive transistor T2, and a hold capacitor C1 as a thin film element. The gate of the sampling transistor T1 is connected to the scan line WS. One of the source and the drain of the sampling transistor T1 is connected to the signal line SL, and the other is connected to the gate G of the drive transistor T2. One of the source and the drain of the drive transistor T2 is connected to the light-emitting element EL, and the other is connected to the power feed line DS. In this form, the drive transistor T2 is an N-channel transistor. The drain side thereof at the time of the light emission of the light-emitting element EL is connected to the power feed line DS, and the source side thereof is connected to the anode side of the light-emitting element EL. The cathode of the light-emitting element EL is fixed at a predetermined cathode potential Vcat. The hold capacitor C1 is connected between the source S and the gate G of the drive transistor T2. The control scanner (write scanner) 4 sequentially outputs the control signal pulse to the pixels 2 having this configuration by switching the potentials of the scan lines WS between the lower potential and the higher potential, to thereby line-sequentially scan the pixels 2 on a row-by-row basis. The power supply scanner (drive scanner) 5 provides the supply voltage that is switched between a first potential Vcc and a second potential Vss to the respective power feed lines DS in matching with the line-sequential scanning. The signal selector (horizontal selector) 3 supplies a signal potential Vsig and a reference potential Vofs as the video signal to the signal lines SL along the columns in matching with the line-sequential scanning. The signal potential Vsig and the reference potential Vofs are alternately supplied in one horizontal period (1 H).

The sampling transistor T1 is kept at the on-state during the period from the rising of the control pulse supplied from the control scanner (write scanner) 4 to the scan line WS to the falling of the control pulse in the time zone during which the video signal supplied to the signal line SL is at the signal potential Vsig, and samples the signal potential Vsig from the signal line SL to write it to the hold capacitor C1. In addition, the sampling transistor T1 carries out negative feedback of the drive current flowing through the drive transistor T2 at this time to the hold capacitor C1, to thereby give correction for the mobility μ of the drive transistor T2 to the signal potential written to the hold capacitor C1.

In this configuration, the sampling transistor T1 is kept at the on-state during the period from the rising of the control pulse supplied from the control scanner to the scan line WS to the falling of the control pulse with a time width shorter than one horizontal cycle (1 H), and samples the signal potential Vsig from the signal line SL to write it to the hold capacitor C1. As a feature of the embodiments of the present invention, the sampling transistor T1 has a double gate structure in which a pair of transistor elements are connected in series between the signal line SL and the gate G of the drive transistor T2 and the gates of both transistor elements are connected in common. Compared with the case in which the double gate structure is not employed, change in the threshold voltage of the sampling transistor T1 is suppressed, and thereby change in the width of the time during which the sampling transistor T1 is in the on-state (signal writing time) is suppressed. The drive transistor T2 causes a drive current dependent on the signal potential Vsig written to the hold capacitor C1 to flow to the light-emitting element EL. The light-emitting element EL emits light with the luminance dependent on this drive current.

Referring next to FIG. 2B, the operation of this pixel circuit 2 will be described below. A consideration will be made on the state at the end of signal writing with the sampling transistor T1 having the double gate structure. When the sampling transistor T1 is turned off at the end of signal writing, coupling from the gate of the sampling transistor T1 is input to an intermediate node A between two transistor elements of the sampling transistor T1. This coupling amount is large because no hold capacitor exists at the node A. At this time, the coupling is input also to the gate of the drive transistor T2. However, the coupling amount when the sampling transistor T1 is turned off is small because the combined capacitance of the hold capacitor C1, the gate-source capacitance Cgs of the drive transistor, the gate-drain capacitance Cgd of the drive transistor, and the parasitic capacitance Cel of the light-emitting element EL is seen from the gate of the drive transistor T2. Furthermore, at the time of white displaying, the gate potential of the drive transistor T2 rises up due to bootstrap operation and becomes a potential of Vsig(white)'.

At the time of white displaying, potentials of Vsig and Vofs are repeated as the signal line potential. When the signal line is at the potential of Vofs, the magnitude relationship among the potentials of the respective nodes of the sampling transistor T1 in the white displaying is as follows, in consideration of the above-described coupling.

the signal line<the node A<<the gate of the drive transistor T2

At this time, due to the gate potential of the drive transistor T2, a large electric field is applied to the transistor element closer to the gate of the drive transistor T2, of two transistor elements of the sampling transistor T1. The drain-source voltage of the transistor element closer to the gate of the drive transistor T2 is higher than that of the transistor element closer to the signal line. In general, change in the threshold voltage of a transistor over time depends on the drain-source voltage of the transistor. Therefore, at this time, the amount of change in the threshold voltage is larger in the transistor element closer to the gate of the drive transistor T2, and the threshold voltage is shifted toward the negative side. However, the drain-source voltage of the transistor element closer to the signal line is low. Therefore, in total, the threshold voltage of the sampling transistor T1 becomes more dependent on the threshold voltage closer to the signal line with time elapse. This is because the threshold voltage of the transistor element closer to the gate of the drive transistor T2 is shifted toward the negative side and thus the resistance of the transistor element closer to the gate of the drive transistor T2 can be regarded as being lowered.

Due to the above-described reason, by employing a double gate transistor as the sampling transistor T1, the amount of change in the threshold voltage over time as the whole of the sampling transistor can be suppressed, and thus the amount of change in the signal writing time can also be suppressed. As a result, reduction in the current flowing to the light-emitting element EL and the lowering of the light-emission luminance with time elapse and the occurrence of image quality defects such as streaks and unevenness can be diminished.

FIG. 3 is a schematic sectional view showing a structural example of the sampling transistor T1 shown in FIGS. 2A and 2B. As shown in the diagram, the sampling transistor T1 has the double gate structure in which a pair of transistor elements T11 and T12 are connected in series via the intermediate node A. This double gate structure is formed over a substrate 51. A pair of gate electrodes G1 and G2 are disposed on the substrate 51. One gate electrode G1 serves as the control terminal of the transistor element T11, and the other gate electrode G2 serves as the control terminal of the transistor element T12. The pair of gate electrodes G1 and G2 are connected in common and serve as the gate of the sampling transistor T1. As described above, the gate of the sampling transistor T1 is connected to the scan line WS.

The pair of gate electrodes G1 and G2 are covered by a gate insulating film 52. A semiconductor thin film 53 is formed in an island manner on the gate insulating film 52. This semiconductor thin film 53 is e.g. a polycrystalline silicon thin film, an amorphous silicon thin film, or a microcrystalline silicon thin film. In this semiconductor thin film 53, the region located directly above the gate electrode G1 serves as a channel region CH1 of the transistor element T11. Furthermore, the region located directly above the gate electrode G2 serves as a channel region CH2 of the transistor element T12. Both the channel regions CH1 and CH2 are connected to each other at the intermediate node A.

The semiconductor thin film 53 is covered by an interlayer insulating film 54. A source electrode S and a drain electrode D are formed on the interlayer insulating film 54 and are connected to both ends of the semiconductor thin film 53 via contact holes opened in the interlayer insulating film 54. In this manner, the source electrode S and the drain electrode D serving as the current terminals of the sampling transistor T1 are formed. In the diagram, the source electrode S is connected to the signal line SL, and the drain electrode D is connected to the gate of the drive transistor T2.

Figure 4:
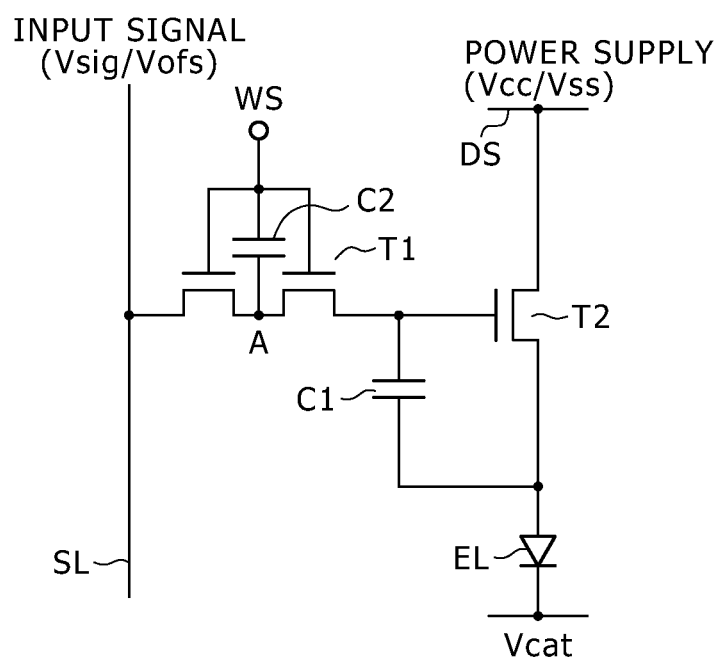
FIG. 4 is a diagram showing a pixel circuit in a display device according to a second embodiment of the present invention.

FIG. 4 is a schematic circuit diagram showing a second embodiment of the present invention. In FIG. 4, the parts corresponding to those in the first embodiment shown in FIGS. 2A and 2B are given the corresponding reference symbols for easy understanding. The second embodiment is an improvement to the first embodiment and has a configuration for further suppressing change in the threshold voltage of the sampling transistor T1. In the sampling transistor T1, a capacitor C2 is formed between the intermediate node A, which interconnects the pair of transistor elements, and the gate connected to the scan line WS. Due to the provision of the capacitor C2 between the control line of the sampling transistor T1 and the intermediate node A, the value of the coupling input to the node A when the sampling transistor T1 is turned off can be set larger than that in the first embodiment.

That is, the potential of the intermediate node A at the time of white light emission can be set lower than that in the first embodiment.

Due to this feature, the value of the drain-source voltage of the transistor element closer to the signal line (the voltage between the signal line and the intermediate node A) at the time of white light emission can be set smaller than that in the first embodiment. As described above, change in the threshold voltage of a transistor over time depends on the drain-source voltage of the transistor, and therefore the amount of aging change in the threshold voltage of the transistor element closer to the signal line, of the double gate structure, is small. Thus, using the present embodiment can enhance the effect of diminishing change in the operating point of the transistor element closer to the signal line due to the coupling at the end of signal writing.

Furthermore, the amount of change in the threshold voltage over time as the whole of the sampling transistor becomes more dependent on the amount of change in the threshold voltage of the transistor element closer to the signal line with time elapse as described above. Therefore, using the present embodiment can further suppress the amount of change in the threshold voltage as the whole of the sampling transistor. Thus, the lowering of the light-emission luminance with time elapse and the occurrence of image quality defects such as streaks and unevenness can be further diminished compared with the first embodiment.

In addition, the present embodiment can be applied to not only the sampling transistor in the pixel circuit but also a switching transistor that is turned on/off on the order of several microseconds, and allows diminishing of change in the on-time of the switching transistor over time.

Figure 5A:
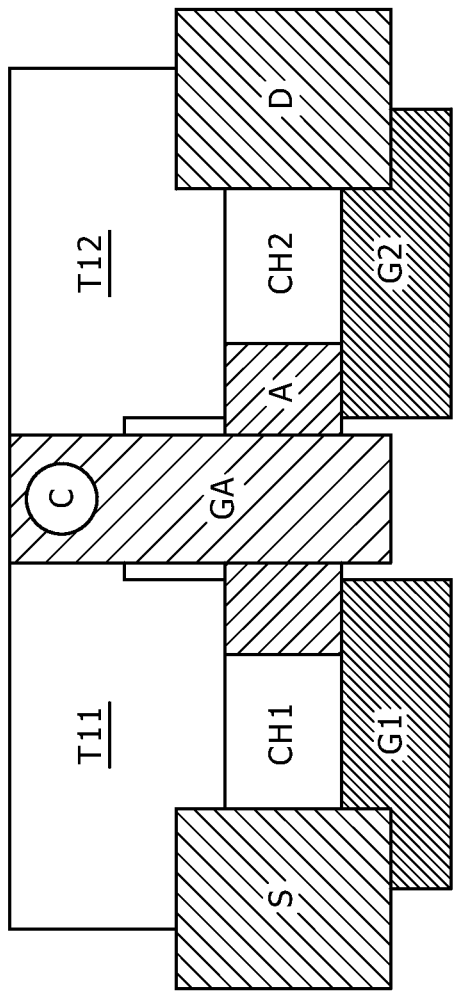
FIGS. 5A and 5B are schematic plan view and sectional view showing the double gate structure of a sampling transistor included in the pixel circuit shown in FIG. 4.
Figure 5B:
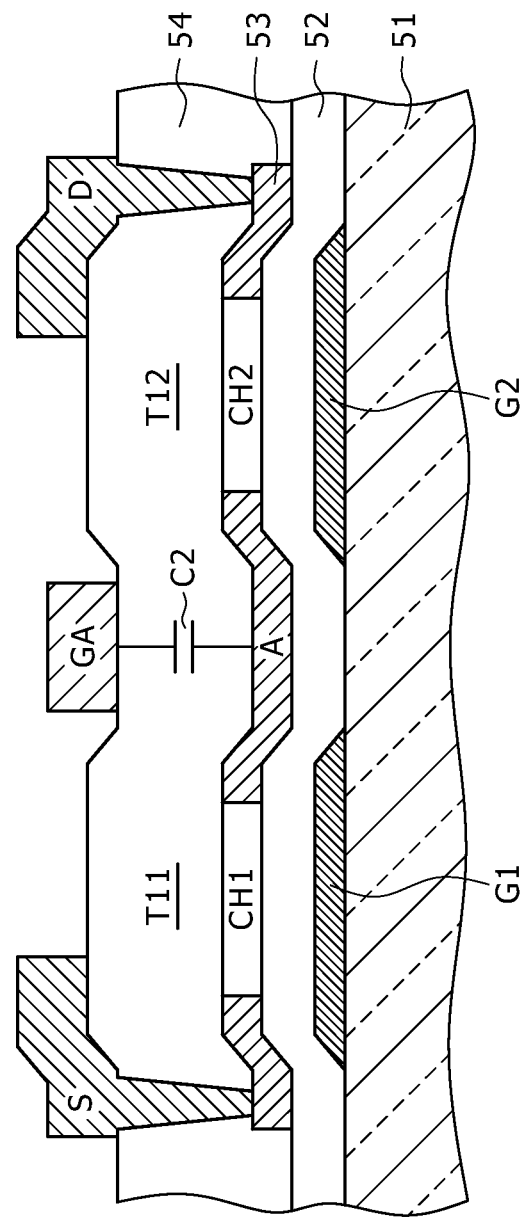

FIGS. 5A and 5B are schematic diagrams showing a structural example of the sampling transistor according to the second embodiment shown in FIG. 4. FIG. 5A is a plan view of the sampling transistor, and FIG. 5B is a sectional view of the sampling transistor. The sectional view of FIG. 5B employs the same representation manner as that of the sectional view of the sampling transistor T1 of the first embodiment shown in FIG. 3 for easy understanding. As shown in the diagram, an electrode GA is formed on the interlayer insulating film 54. This electrode GA is formed by etching a metal such as aluminum into a predetermined pattern, as with the source electrode S and the drain electrode D. In the semiconductor thin film 53, the region serving as the intermediate node A is formed between the pair of channel regions CH1 and CH2. The above-described electrode GA faces this intermediate node region A with the intermediary of the interlayer insulating film 54 and provides the above-described capacitor C2. As shown in the plan view FIG. 5A, the electrode GA is connected to the gate electrodes G1 and G2 below the electrode GA via a contact hole C. That is, the gate electrodes G1 and G2 and the capacitor electrode GA are connected in common. In the present embodiment, the film thickness of the insulating film 54, which forms the gate capacitor C2 of the sampling transistor T1, is larger than that of the insulating film 52 between the gates G1, G2 and the channel regions CH1, CH2 of the pair of transistor elements T11, T12. That is, the capacitance of the capacitor C2 per unit area is lower than that between the gates (G1, G2) and the channel regions (CH1, CH2) per unit area. Thus, forming the necessary capacitor C2 by the intermediate node region A of the semiconductor thin film 53 and the electrode GA formed on the interlayer insulating film 54 offers an advantage that a wide margin is ensured for variation in the overlapping area between both.

Figures 6A, 6B:
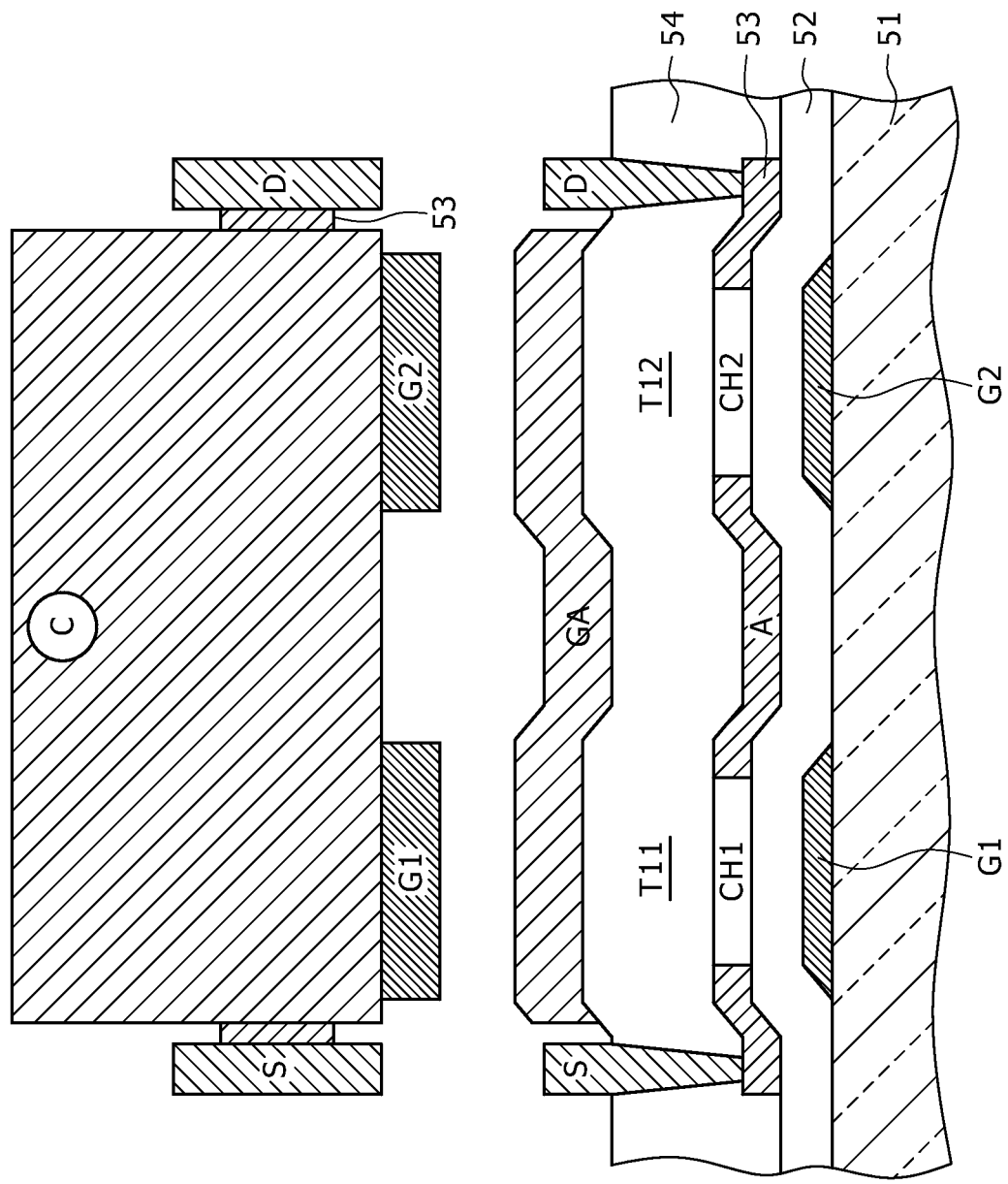
FIGS. 6A and 6B are plan view and sectional view showing a modification example of the embodiment shown in FIGS. 5A and 5B.

FIGS. 6A and 6B are schematic diagrams showing a modification example of the sampling transistor having the double gate structure shown in FIGS. 5A and 5B. In FIGS. 6A and 6B, the parts corresponding to those in the sampling transistor shown in FIGS. 5A and 5B are given the corresponding reference numerals and symbols for easy understanding. In the present example, the capacitor electrode GA formed on the interlayer insulating film 54 is expanded to cover the pair of transistor elements T11 and T12 from above. Specifically, the channel regions CH1 and CH2 of the pair of transistor elements T11 and T12 are covered by the electrode GA that is formed on the opposite side with the intermediary of the gates (G1, G2) and the channel regions (CH1, CH2) and is composed of a metal at the same potential as that of the gates (G1, G2).

As above, the present example has a structure in which the channel regions (CH1, CH2) of the sampling transistor T1 having the double gate structure are covered by the electrode GA composed of aluminum or the like. That is, the sampling transistor of the present example has a sandwich gate structure. In addition, the intermediate region A, which interconnects the pair of channel regions CH1 and CH2, is also covered by this metal electrode GA. By employing the sandwich gate structure in this manner, when the sampling transistor T1 for light emission is in the off-state, an electric field generated from the gate (G1, G2) of the sampling transistor T1 can be cancelled by the metal electrode GA, which is on the opposite side to the gate and at the same potential as that of the gate. Due to this feature, electrons in the semiconductor thin film 53 are hardly trapped in the interlayer insulating film 54, and thus the shift of the threshold voltage with time elapse can be suppressed. Moreover, by inputting coupling to the intermediate node A of the sampling transistor having the double gate structure, the amount of change in the threshold voltage of the transistor element T11 closer to the signal line can be suppressed also in terms of the operating point. Thus, the lowering of the light-emission luminance with time elapse and the occurrence of image quality defects such as streaks and unevenness can be further diminished.

In the present embodiment, the sampling transistor has the double gate structure, and a capacitor is formed between the connecting node of two transistor elements of the double gate structure and the control line of the sampling transistor. Thereby, the value of the coupling input to the connecting node when the sampling transistor is turned off can be made larger, and thus the drain-source voltage of the transistor closer to the signal line at the time of the light emission of the light-emitting element EL can be made lower.

By the present embodiment, the drain-source voltage of the transistor element closer to the signal line can be made low. Therefore, change in the threshold voltage as the whole of the sampling transistor can be suppressed, and the lowering of the light-emission luminance with time elapse and the occurrence of image quality defects such as streaks and unevenness can be suppressed.

In the present embodiment, the capacitor C2 connected between the connecting node A and the control line WS is formed by the Al electrode GA connected to the control line and the Poly-Si film 53. This makes it possible to ensure a wide margin for variation attributed to the process.

In the present embodiment, it is also possible to cover all of the Poly-Si region by the Al connected to the control line to thereby make a sandwich gate structure. This allows diminishing of the effect due to an electric field generated from the gate in addition to the increase in the amount of coupling to the intermediate node of the above-described double gate structure. Thus, change in the threshold voltage as the whole of the sampling transistor can be suppressed, which allows suppression of the lowering of the light-emission luminance with time elapse and the occurrence of image quality defects such as streaks and unevenness.

Figure 7:
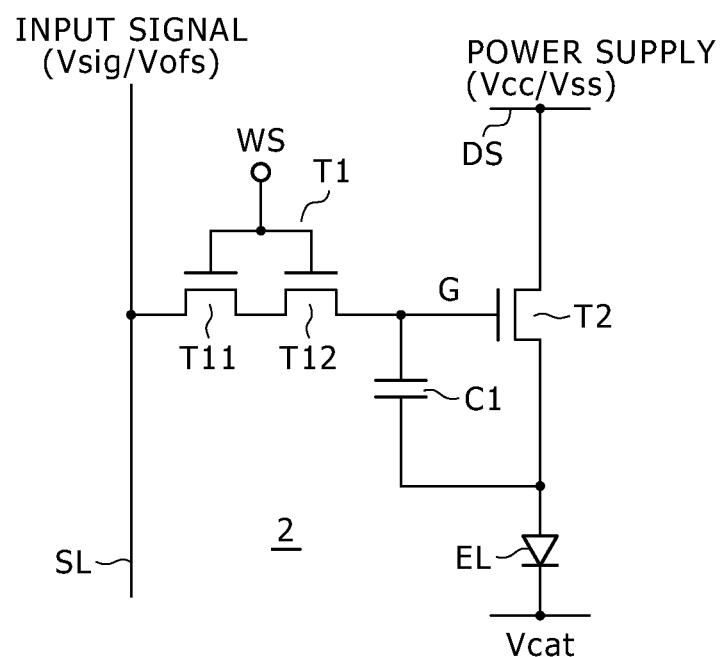
FIG. 7 is a circuit diagram showing a display device according to a third embodiment of the present invention.

FIG. 7 is a schematic circuit diagram showing a display device according to a third embodiment of the present invention. In FIG. 7, the parts corresponding to those in the first embodiment shown in FIGS. 2A and 2B are given the corresponding reference symbols for easy understanding. In the sampling transistor T1 according to the present embodiment, the pair of transistor elements T11 and T12 are different from each other in the channel length. Specifically, of the pair of transistor elements T11 and T12, the channel length of the transistor element T11 closer to the signal line SL is larger than that of the transistor element T12 closer to the gate G of the drive transistor T2. Preferably, the pair of transistor elements T11 and T12 have the same channel width.

A characteristic of the present embodiment is that the sampling transistor T1 has the double gate structure and, of two transistor elements of the double gate structure, the transistor element closer to the signal line has channel length larger than that of the transistor element closer to the gate of the drive transistor. In general, there is a tendency that the amount of change in the threshold voltage of a transistor over time becomes smaller as the channel length of the transistor becomes larger. By using the present embodiment, in addition to the above-described effect of diminishing change in the operating point of the transistor closer to the signal line due to the coupling at the end of signal writing, the diminishing effect obtained by setting the channel length large can also be achieved. Furthermore, the amount of change in the threshold voltage over time as the whole of the sampling transistor becomes more dependent on the amount of change in the threshold voltage of the transistor element closer to the signal line with time elapse as described above. Therefore, using the present embodiment can further suppress the amount of change in the threshold voltage as the whole of the sampling transistor. As a result, the lowering of the light-emission luminance with time elapse and the occurrence of image quality defects such as streaks and unevenness can be diminished. In addition, the present embodiment can be applied to not only the sampling transistor in the pixel circuit but also a switching transistor that is turned on/off on the order of several microseconds, and allows diminishing of change in the on-time of the switching transistor over time.

Figure 8:
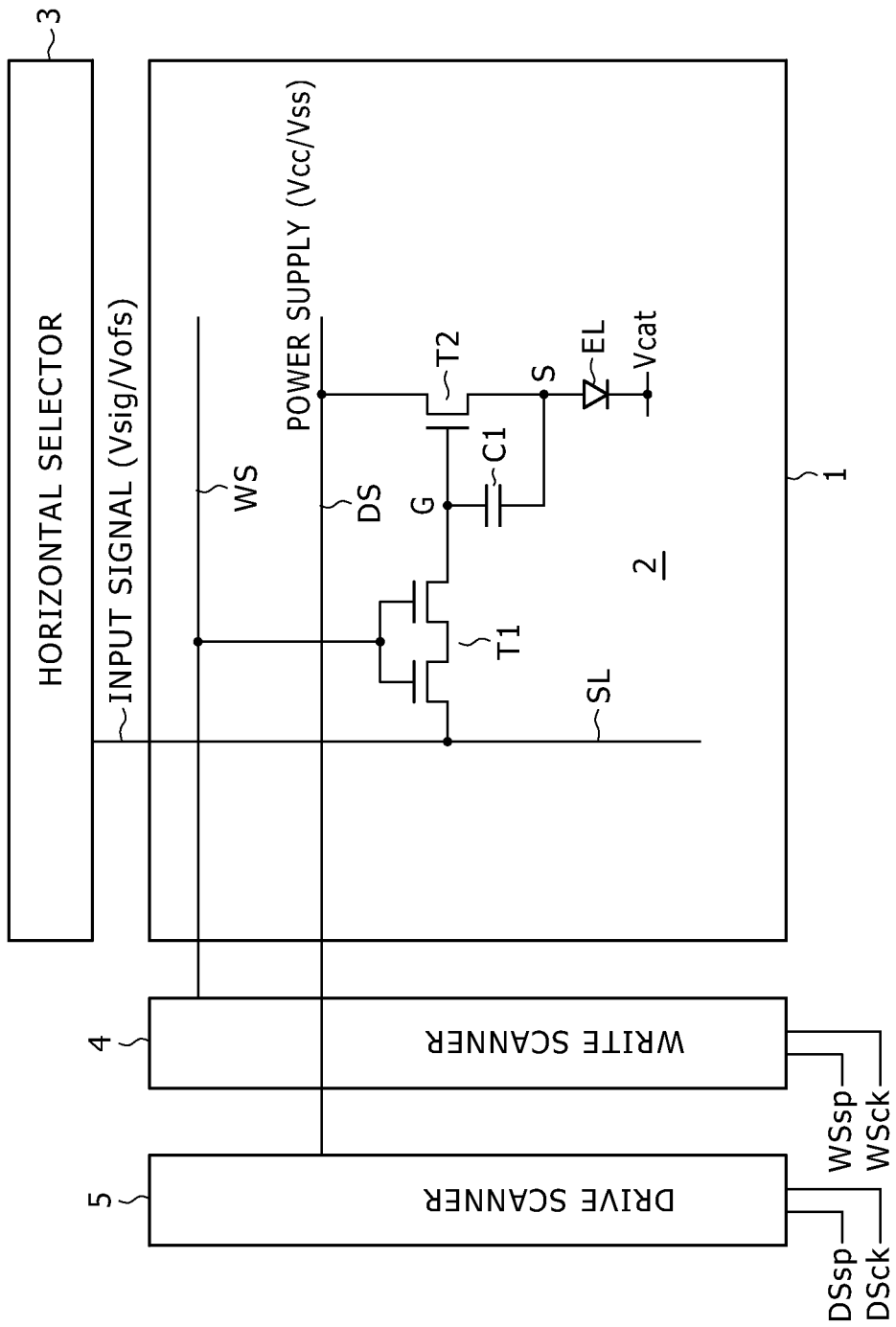
FIG. 8 is a circuit diagram showing a configuration example of the display device according to the embodiments of the present invention.

Next, the overall operation of the display device according to the embodiments of the present invention will be described in detail below. FIG. 8 is a circuit diagram showing the circuit configuration of the display device according to the embodiments of the present invention. To simplify the illustration for easy understanding, one pixel circuit is shown as a representative in the pixel array part 1 of this display device. This pixel circuit 2 includes the light-emitting element EL that is a two-terminal element (diode-type element) typified by e.g. an organic EL device, the N-channel sampling transistor T1, the N-channel drive transistor T2, and the hold capacitor C1 as a thin film element. The gate of the sampling transistor T1 is connected to the scan line WS. One of the source and the drain of the sampling transistor T1 is connected to the signal line SL, and the other is connected to the gate G of the drive transistor T2. One of the source and the drain of the drive transistor T2 is connected to the light-emitting element EL, and the other is connected to the power feed line DS. In this form, the drive transistor T2 is an N-channel transistor. The drain side thereof at the time of the light emission of the light-emitting element EL is connected to the power feed line DS, and the source side thereof is connected to the anode side of the light-emitting element EL. The cathode of the light-emitting element EL is fixed at the predetermined cathode potential Vcat. The hold capacitor C1 is connected between the source S and the gate G of the drive transistor T2. The control scanner (write scanner) 4 sequentially outputs the control signal to the pixels 2 having this configuration by switching the potentials of the scan lines WS between the lower potential and the higher potential, to thereby line-sequentially scan the pixels 2 on a row-by-row basis. The power supply scanner (drive scanner) 5 provides the supply voltage that is switched between the first potential Vcc and the second potential Vss to the respective power feed lines DS in matching with the line-sequential scanning. The signal selector (horizontal selector) 3 supplies the signal potential Vsig and the reference potential Vofs as the video signal to the signal lines SL along the columns in matching with the line-sequential scanning.

In this configuration, the sampling transistor T1 is kept at the on-state during the period from the rising of the control pulse supplied from the control scanner (write scanner) 4 to the scan line WS to the falling of the control pulse in the time zone during which the video signal supplied to the signal line SL is at the signal potential Vsig, and samples the signal potential Vsig from the signal line SL to write it to the hold capacitor C1. In addition, the sampling transistor T1 carries out negative feedback of the drive current flowing through the drive transistor T2 at this time to the hold capacitor C1, to thereby give correction relating to the mobility μ of the drive transistor T2 to the signal potential written to the hold capacitor C1.

The pixel circuit shown in FIG. 8 has a threshold voltage correction function in addition to the above-described mobility correction function. Specifically, the power supply scanner (drive scanner) 5 switches the potential of the power feed line DS from a first potential Vcc to a second potential Vss at a first timing before the sampling of the signal potential Vsig by the sampling transistor T1. The control scanner (write scanner) 4 turns on the sampling transistor T1 at a second timing before the sampling of the signal potential Vsig by the sampling transistor T1 similarly, to thereby apply the reference potential Vofs from the signal line SL to the gate G of the drive transistor T2 and set the potential of the source S of the drive transistor T2 to the second potential Vss from the potential at the time of the light emission. The power supply scanner (drive scanner) 5 switches the potential of the power feed line DS from the second potential Vss to the first potential Vcc at a third timing after the second timing, to thereby hold the voltage equivalent to the threshold voltage Vth of the drive transistor T2 in the hold capacitor C1. This threshold voltage correction function allows this display device to cancel the influence of variation in the threshold voltage Vth of the drive transistor T2 from pixel to pixel. Either the first timing or the second timing may be earlier than the other.

The pixel circuit 2 shown in FIG. 8 is also provided with a bootstrap function. Specifically, at the timing when the signal potential Vsig has been held in the hold capacitor C1, the write scanner 4 turns off the sampling transistor T1 to thereby electrically isolate the gate G of the drive transistor T2 from the signal line SL. This allows the gate potential of the drive transistor T2 to be linked to change in the source potential of the drive transistor T2 and thus allows the voltage Vgs between the gate G and the source S to be kept constant. Therefore, even when the current-voltage characteristic of the light-emitting element EL changes over time, the gate voltage Vgs can be kept constant and thus no change occurs in the luminance.

Figure 9:
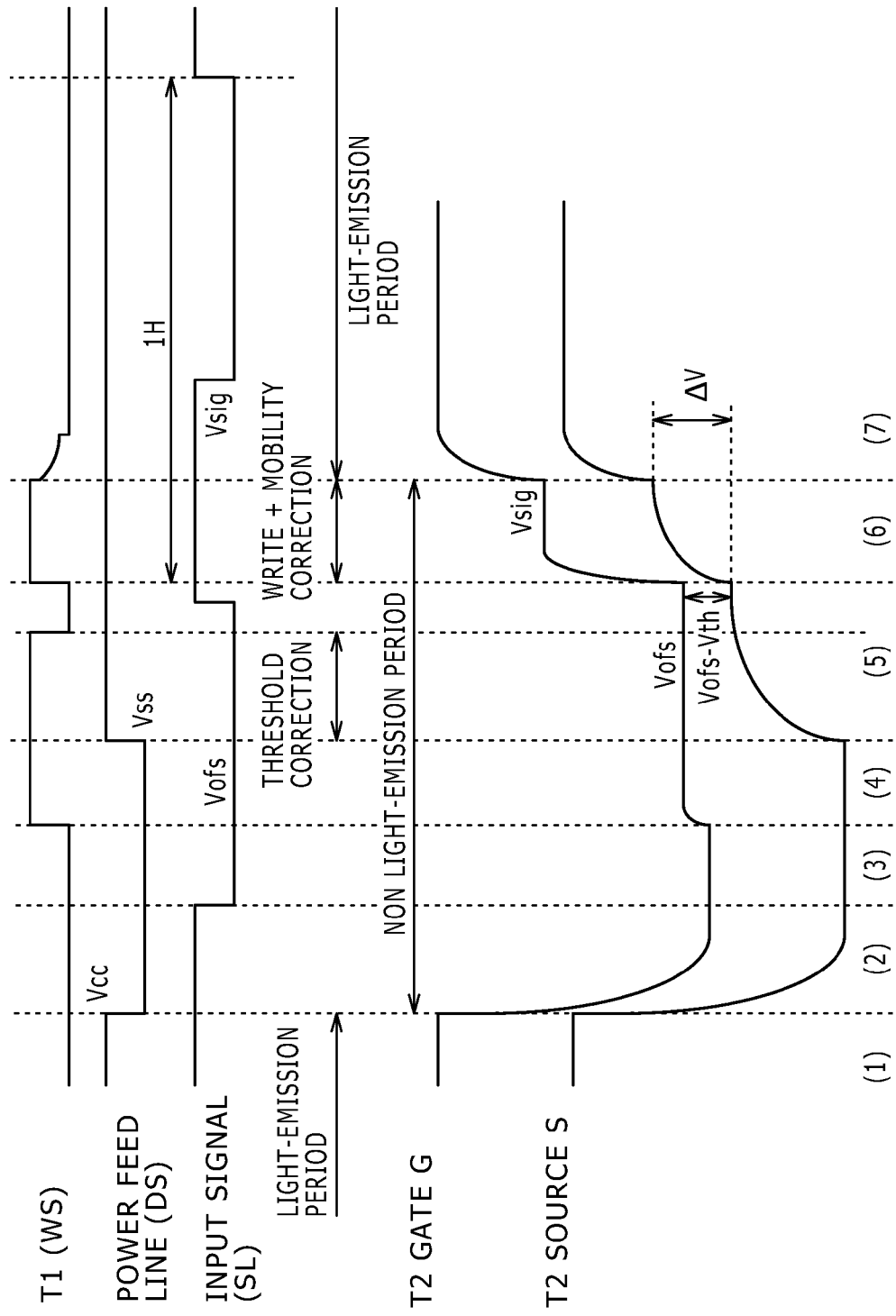
FIG. 9 is a timing chart for explaining the operation of the display device shown in FIG. 8.

FIG. 9 is a timing chart for explaining the operation of the pixel shown in FIG. 8. This timing chart is one example and the control sequence of the pixel circuit shown in FIG. 8 is not limited to the timing chart of FIG. 9. In this timing chart, potential changes of the scan line WS, the power feed line DS, and the signal line SL are shown along the same time axis. The potential change of the scan line WS corresponds to the control signal and controls the opening/closing of the sampling transistor T1. The potential change of the power feed line DS corresponds to the switching of the supply voltage between Vcc and Vss. The potential change of the signal line SL corresponds to the switching of the input signal between the signal potential Vsig and the reference potential Vofs. Furthermore, in parallel to these potential changes, potential changes of the gate G and the source S of the drive transistor T2 are also shown. The potential difference between the gate G and the source S is equivalent to Vgs as described above.

In this timing chart, the operation period is divided into periods (1) to (7) corresponding to the transition of the pixel operation for convenience. In the period (1) immediately before the start of the description-subject field, the light-emitting element EL is in the light-emission state. Thereafter, a new field of the line-sequential scanning starts. At the start of the first period (2) of the new field, the potential of the power feed line DS is switched from the first potential Vcc to the second potential Vss. At the start of the next period (3), the input signal is switched from Vsig to Vofs. At the start of the next period (4), the sampling transistor T1 is turned on. In the periods (2) to (4), the gate potential and the source potential of the drive transistor T2 are initialized from those at the time of the light emission. The periods (2) to (4) are equivalent to a preparatory period for the threshold voltage correction. In this preparatory period, the gate G of the drive transistor T2 is initialized to Vofs and the source S thereof is initialized to Vss. Subsequently, the threshold voltage correction operation is carried out in the threshold correction period (5), so that the voltage equivalent to the threshold voltage Vth is held between the gate G and the source S of the drive transistor T2. In practice, the voltage equivalent to Vth is written to the hold capacitor C1 connected between the gate G and the source S of the drive transistor T2. After the sampling transistor T1 is temporarily turned off, the writing period/mobility correction period (6) starts. In this period, the signal potential Vsig of the video signal is written to the hold capacitor C1 in such a manner as to be added to Vth, and the voltage ΔV for the mobility correction is subtracted from the voltage held in the hold capacitor C1. In this writing period/mobility correction period (6), the sampling transistor T1 should be kept at the conductive state in the time zone during which the signal line SL is at the signal potential Vsig. Thereafter, the light-emission period (7) starts, so that the light-emitting element emits light with the luminance dependent on the signal potential Vsig. In this light emission, the light-emission luminance of the light-emitting element EL is not affected by variations in the threshold voltage Vth and the mobility μ of the drive transistor T2 because the signal potential Vsig has been adjusted with the voltage equivalent to the threshold voltage Vth and the voltage ΔV for the mobility correction. At the initial stage of the light-emission period (7), bootstrap operation is carried out and thereby the gate potential and the source potential of the drive transistor T2 rise up with the voltage Vgs between the gate G and the source S of the drive transistor T2 kept constant.

Figure 10:
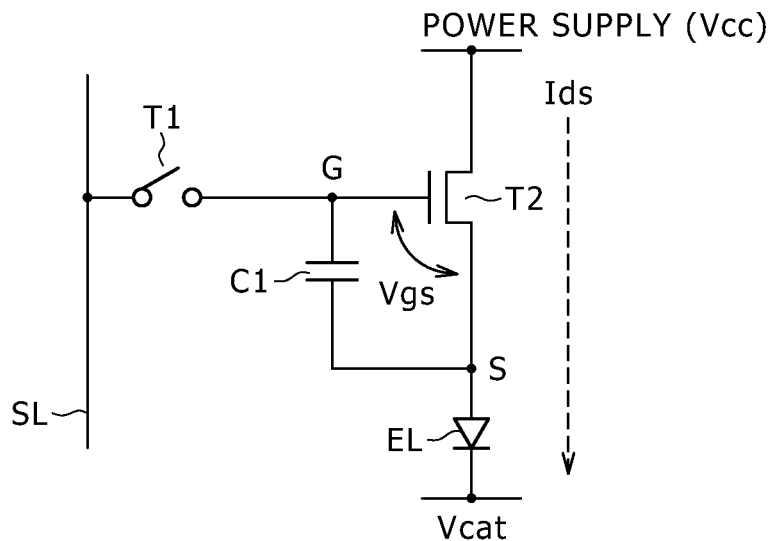
FIG. 10 is a schematic diagram for explaining the operation of the pixel shown in FIG. 8.

With reference to FIGS. 10 to 17, the operation of the pixel circuit shown in FIG. 8 will be described in detail below. Referring initially to FIG. 10, in the light-emission period (1), the supply potential is set to Vcc and the sampling transistor T1 is kept at the off-state. At this time, the drive current Ids flowing to the light-emitting element EL has the value represented by the above-mentioned transistor characteristic equation depending on the voltage Vgs applied between the gate G and the source S of the drive transistor T2 because the drive transistor T2 is so set as to operate in the saturation region.

Figure 11:
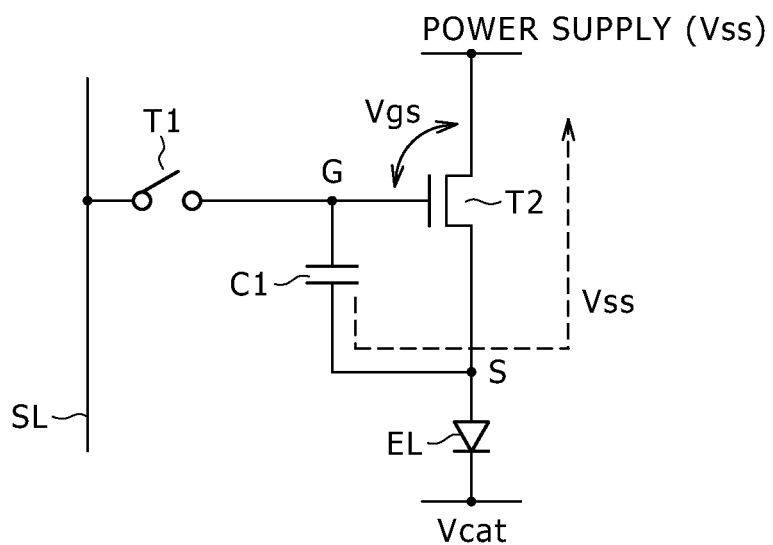
FIG. 11 is a schematic diagram for explaining the operation of the pixel shown in FIG. 8.

Referring next to FIG. 11, at the start of the preparatory period (2), (3), the potential of the power feed line (power supply line) is set to Vss. Vss is so designed as to be lower than the sum of the threshold voltage Vthel and the cathode voltage Vcat of the light-emitting element EL. That is, the relationship Vss<Vthel+Vcat is satisfied. Therefore, the light-emitting element EL stops the light emission and the power supply line side becomes the source of the drive transistor T2. At this time, the anode of the light-emitting element EL is charged to Vss.

Figure 12:
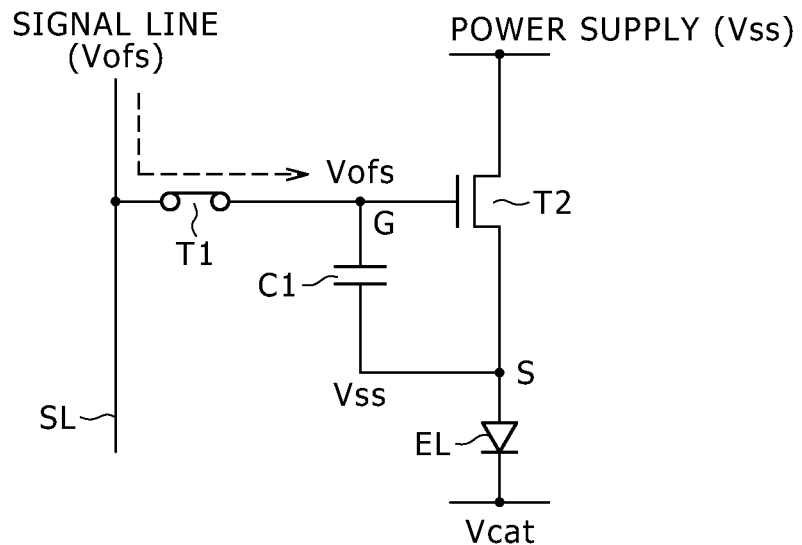
FIG. 12 is a schematic diagram for explaining the operation of the pixel shown in FIG. 8.

Referring next to FIG. 12, in the next preparatory period (4), the potential of the signal line SL is Vofs and the sampling transistor T1 is turned on, so that the gate potential of the drive transistor T2 is set to Vofs. In this way, the potentials of the source S and the gate G of the drive transistor T2 are initialized from those at the time of the light emission, so that the gate-source voltage Vgs becomes Vofs−Vss. This Vgs (=Vofs−Vss) is so designed as to be higher than the threshold voltage Vth of the drive transistor T2. By thus initializing the drive transistor T2 so that the relationship Vgs>Vth may be satisfied, the preparation for the threshold voltage correction operation in the next period is completed.

Figure 13:
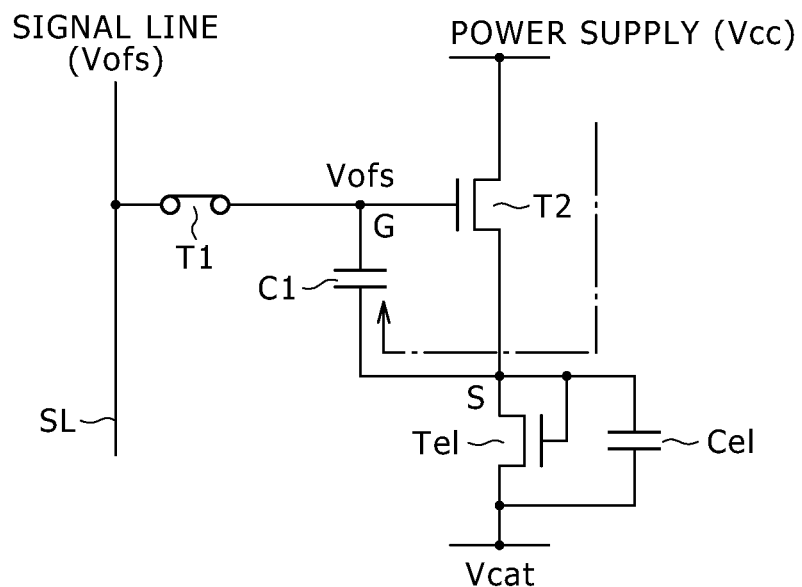
FIG. 13 is a schematic diagram for explaining the operation of the pixel shown in FIG. 8.

Referring next to FIG. 13, at the start of the threshold voltage correction period (5), the potential of the power feed line DS (power supply line) is returned to Vcc. Switching the supply voltage to Vcc causes the anode side of the light-emitting element EL to become the source S of the drive transistor T2, so that a current flows as shown in the diagram. At this time, the equivalent circuit of the light-emitting element EL is represented by parallel connection of a diode Tel and a capacitor Cel as shown in the diagram. Because the anode potential (i.e. the source potential Vss) is lower than Vcat+Vthel, the diode Tel is in the off-state, and therefore the leakage current flowing therethrough is considerably smaller than the current flowing through the drive transistor T2. Therefore, most of the current flowing through the drive transistor T2 is used to charge the hold capacitor C1 and the equivalent capacitor Cel. After the threshold voltage correction, the sampling transistor T1 is temporarily turned off.

Figure 14:
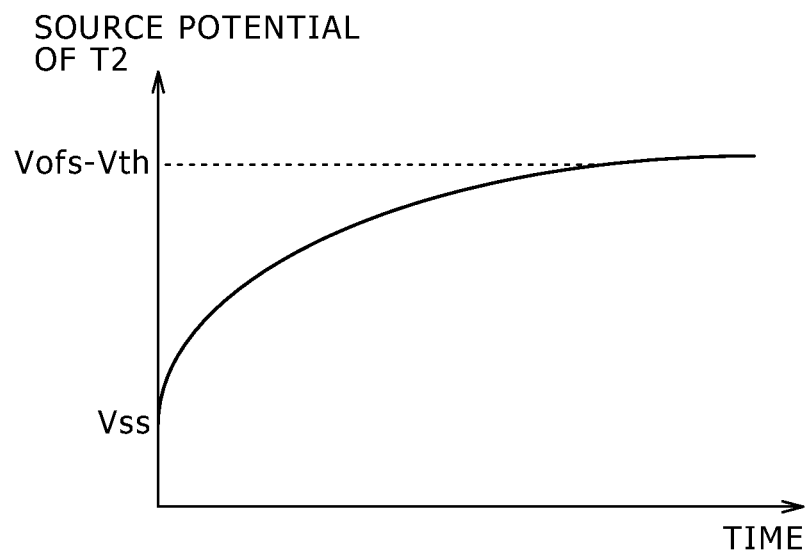
FIG. 14 is a graph for explaining the operation of the pixel shown in FIG. 8.

FIG. 14 shows temporal change in the source potential of the drive transistor T2 in the threshold voltage correction period (5) shown in FIG. 13. As shown in the diagram, the source potential of the drive transistor T2 (i.e. the anode voltage of the light-emitting element EL) increases from Vss with time elapse. After the elapse of the threshold voltage correction period (5), the drive transistor T2 is cut off and the voltage Vgs between the source S and the gate G of the drive transistor T2 becomes Vth. The source potential at this time is Vofs−Vth. If this value Vofs−Vth is still lower than Vcat+Vthel, the light-emitting element EL is in the cut-off state.

Figure 15:
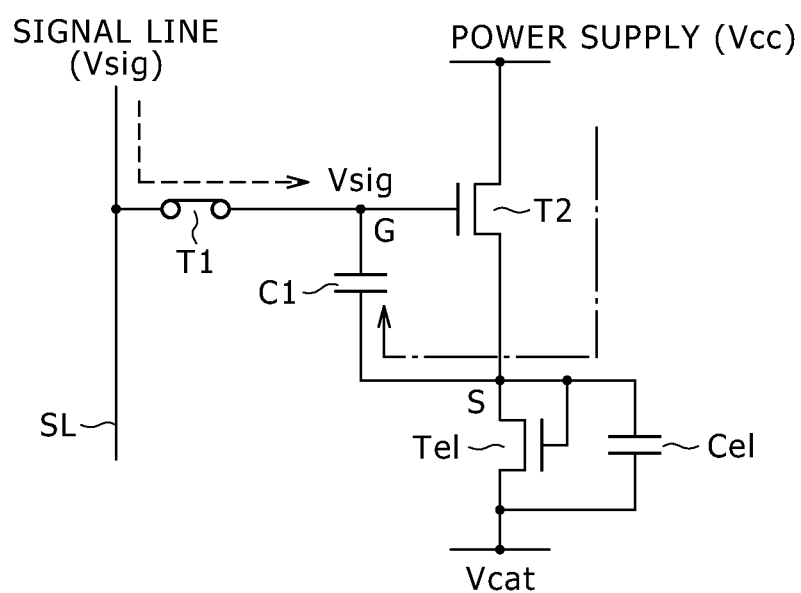
FIG. 15 is a schematic diagram for explaining the operation of the pixel shown in FIG. 8.

Referring next to FIG. 15, at the start of the writing period/mobility correction period (6), the sampling transistor T1 is turned on again in the state in which the potential of the signal line SL has been switched from Vofs to Vsig. The signal potential Vsig corresponds to the grayscale. The gate potential of the drive transistor T2 becomes Vsig because the sampling transistor T1 is turned on. On the other hand, the source potential increases with time elapse because a current flows from the power supply Vcc. Also at this time, the current flowing from the drive transistor T2 is used exclusively for charge of the equivalent capacitor Cel and the hold capacitor C1 if the source potential of the drive transistor T2 does not surpass the sum of the threshold voltage Vthel and the cathode voltage Vcat of the light-emitting element EL. At this time, the current flowing from the drive transistor T2 reflects the mobility μ because the threshold voltage correction operation for the drive transistor T2 has been already completed. Specifically, if the drive transistor T2 has higher mobility μ, the current amount at this time is larger and the increase amount ΔV of the source potential is also larger. In contrast, if the mobility μ is lower, the current amount of the drive transistor T2 is smaller and thus the increase amount ΔV of the source potential is smaller. Due to this operation, the gate voltage Vgs of the drive transistor T2 is so decreased as to reflect the mobility μ, i.e. decreased by ΔV. Thus, Vgs resulting from the complete correction of the mobility μ is obtained at the timing of the completion of the mobility correction period (6).

Figure 16:
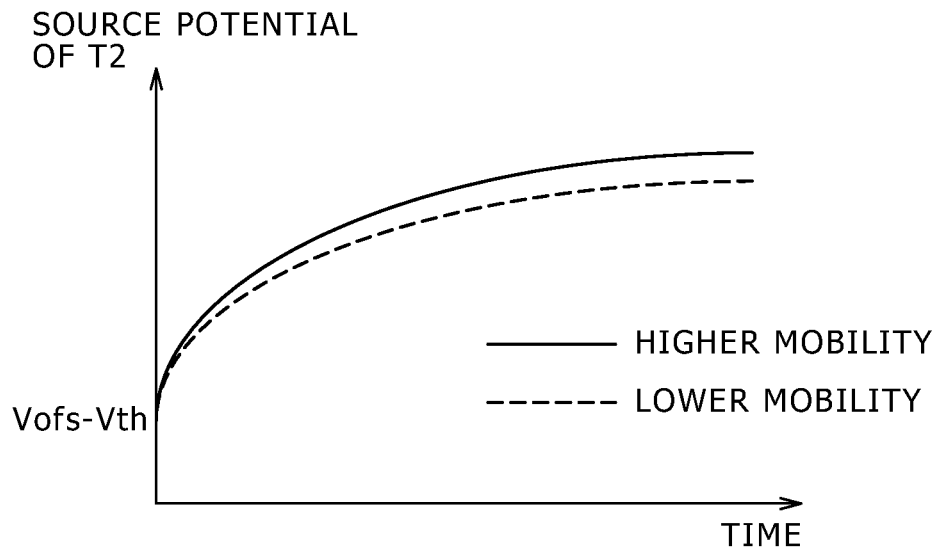
FIG. 16 is a graph for explaining the operation of the pixel shown in FIG. 8.

FIG. 16 is a graph showing temporal changes in the source potential of the drive transistor T2 in the above-described mobility correction period (6). As shown in the diagram, if the mobility of the drive transistor T2 is higher, the source potential increases faster and Vgs is correspondingly decreased. Specifically, if the mobility μ is higher, Vgs is so decreased as to cancel the influence of the higher mobility, and thus the drive current can be suppressed. On the other hand, if the mobility μ is lower, the source voltage of the drive transistor T2 does not increase so fast and therefore Vgs is also not affected strongly. Therefore, if the mobility μ is lower, Vgs of the drive transistor is not greatly decreased so that the low drive capability may be covered.

Figure 17:
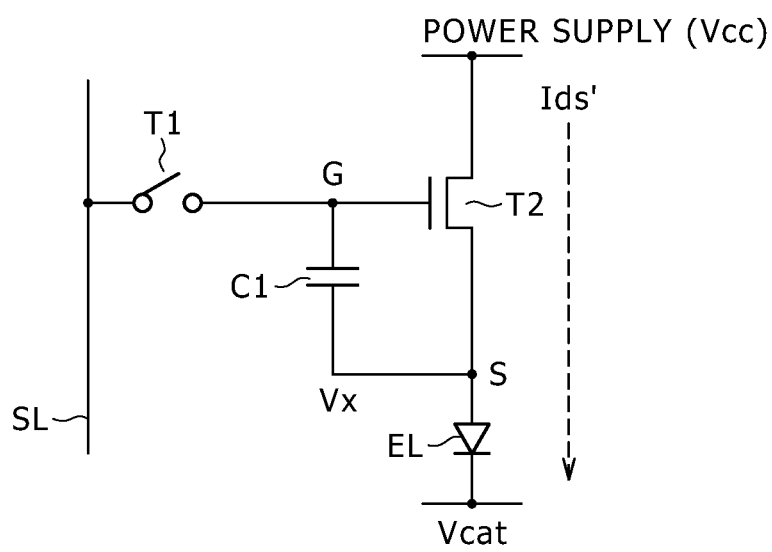
FIG. 17 is a schematic diagram for explaining the operation of the pixel shown in FIG. 8.

FIG. 17 shows the operating state in the light-emission period (7). In this light-emission period (7), the sampling transistor T1 is turned off to cause the light-emitting element EL to emit light. The gate voltage Vgs of the drive transistor T2 is kept constant, and the drive transistor T2 applies a constant current Ids' to the light-emitting element EL in accordance with the above-described characteristic equation. The anode voltage of the light-emitting element EL (i.e. the source potential of the drive transistor T2) increases to Vx because the current Ids' flows to the light-emitting element EL, and the light-emitting element EL starts to emit light at the timing when the anode voltage surpasses Vcat+Vthel. The current-voltage characteristic of the light-emitting element EL changes as the total light-emission time thereof becomes longer. Thus, the potential of the source S shown in FIG. 17 changes. However, the current Ids' flowing to the light-emitting element EL does not change because the gate voltage Vgs of the drive transistor T2 is kept at a constant value due to bootstrap operation. Therefore, even when the current-voltage characteristic of the light-emitting element EL deteriorates, the constant drive current Ids' typically flows continuously and hence the luminance of the light-emitting element EL does not change.

In the operation sequence of the pixel circuit shown in FIG. 9, adaptive control of the mobility correction time (signal writing time) is carried out. Specifically, the adaptive control of the signal writing period (i.e. the mobility correction period) is carried out by giving a slope to the falling edge of the control signal pulse applied to the gate of the sampling transistor T1. The adaptive control refers to a system of automatically carrying out variable adjustment so that the mobility correction period may be optimized depending on the signal potential. The signal potential of the video signal changes in the range from the black level to the white level depending on the grayscale. The optimum mobility correction time is not necessarily constant but depends on the grayscale level of the video signal. As a general tendency, the optimum mobility correction period is short when the luminance is at the white level, and the optimum mobility correction period is long when the luminance is at the black level.

Figure 18:
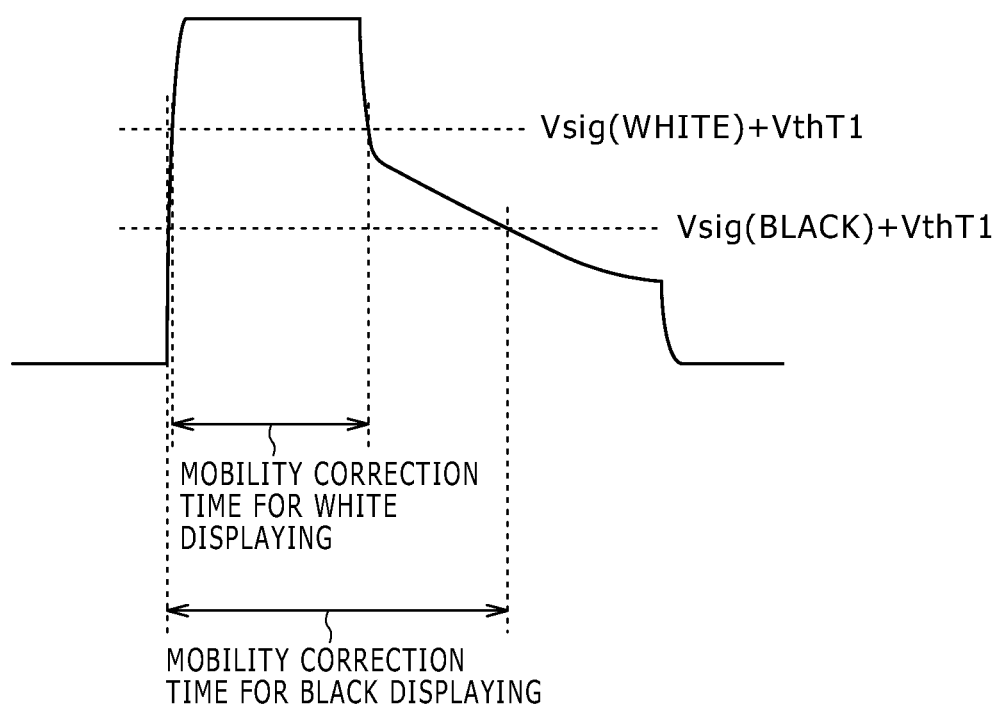
FIG. 18 is a waveform diagram for explaining the operation of the pixel shown in FIG. 8.

With reference to FIG. 18, the adaptive control of the above-described mobility correction period will be specifically described below. The control signal pulse supplied to the scan line WS has a characteristic falling-edge waveform. Specifically, the pulse sharply drops at the beginning and then gradually changes. At the last, the pulse sharply falls down again. The pulse having this falling-edge waveform is applied to the control terminal (gate) of the sampling transistor T1. On the other hand, the signal potential Vsig is applied to the source of the sampling transistor T1. Therefore, the gate-source voltage of the sampling transistor T1 for control of the turning-on/off of the sampling transistor T1 depends on the signal potential Vsig applied to the source.

If the signal potential for white displaying is defined as Vsig(white) and the threshold voltage of the sampling transistor T1 is defined as VthT1, the sampling transistor T1 is turned off at the timing of the intersecting of the falling edge of the control signal pulse with the level of Vsig(white)+VthT1, indicated by a chain line. This turning-off timing is the timing at which the control signal pulse has just started to sharply fall down. Therefore, the signal writing period for white displaying, from the turning-on of the sampling transistor T1 to the turning-off thereof, is short. Thus, the mobility correction period for white displaying is also short.

On the other hand, if the signal potential for black displaying is defined as Vsig(black), the sampling transistor T1 is turned off when the falling edge part of the control signal pulse has become lower than Vsig(black)+VthT1, indicated by a dotted line, as shown in the diagram.

Thus, the signal writing period for black displaying is long. In this manner, the adaptive control of the mobility correction period dependent on the signal potential is carried out. By giving a slope to the falling edge of the control pulse applied to the gate of the sampling transistor T1 in this manner, appropriate mobility correction can be given for all of the grayscales, and uniform image quality free from streaks and unevenness can be achieved. In particular, in the embodiments of the present invention, the double gate structure is employed for the sampling transistor T1 to thereby suppress variation in the threshold voltage VthT1 of the sampling transistor T1. Therefore, the above-described adaptive control of the mobility correction time can be stably carried out. In the case of the sampling transistor T1 that does not have the double gate structure, the threshold voltage VthT1 thereof changes over time and therefore the mobility correction time also changes. Thus, the optimum adaptive control may not be stably carried out.

Figure 19:
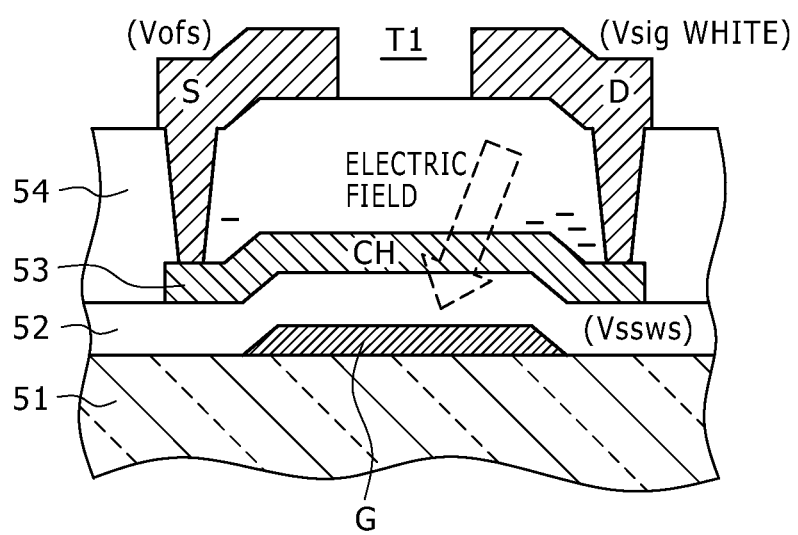
FIG. 19 is a sectional view showing a reference example of the sampling transistor.

FIG. 19 is a schematic sectional view showing a normal sampling transistor T1 that does not have the double gate structure. In FIG. 19, the parts corresponding to those in the sampling transistor T1 having the double gate structure shown in FIG. 3 are given the corresponding reference numerals and symbols for easy understanding. As shown in the diagram, in the sampling transistor T1 having the simple structure, a gate electrode G is formed on the substrate 51, and the semiconductor thin film 53 is formed in an island manner above the gate electrode G with the intermediary of the gate insulating film 52. In this semiconductor thin film 53, the part opposed to the gate electrode G serves as the channel region CH, and both sides thereof serve as the source region and the drain region. The semiconductor thin film 53 is covered by the interlayer insulating film 54, and the source electrode S and the drain electrode D are formed on the interlayer insulating film 54. As described above, the source electrode S is connected to the signal line SL, and the drain electrode D is connected to the gate G of the drive transistor T2.

A discussion will be made below about the operating point of the sampling transistor T1 at the time of the light emission of the light-emitting element EL (particularly, at the time of white displaying). As described above, after the sampling transistor T1 is turned off subsequent to the end of the signal writing, the gate potential of the drive transistor T2 rises up along with the rise of the source potential, and therefore the gate potential becomes higher than the signal potential Vsig. Furthermore, Vofs and Vsig are repeated as the signal line potential.

However, as shown in FIG. 19, a large electric field is applied between the gate and drain of the sampling transistor T1 (between the gate of the sampling transistor T1 and the gate of the drive transistor T2) at the time of white light emission. In the diagram, Vsig(white) denotes the gate potential of the drive transistor and Vssws denotes the off-potential of the sampling transistor T1. The relationship Vssws<Vofs<Vsig(white) is satisfied. As a result, if the occurrence of the electric field continues, electrons in the Poly-Si film 53 are trapped by the insulating film 54 on the Poly-Si and generate a reverse electric field in such a direction as to cancel the electric field. The trapped electrons exist also when the sampling transistor T1 is turned on. Thus, the threshold voltage of the sampling transistor T1 is shifted toward the negative side due to this reverse electric field. Furthermore, this change appears more significantly with time elapse.

Figure 20:
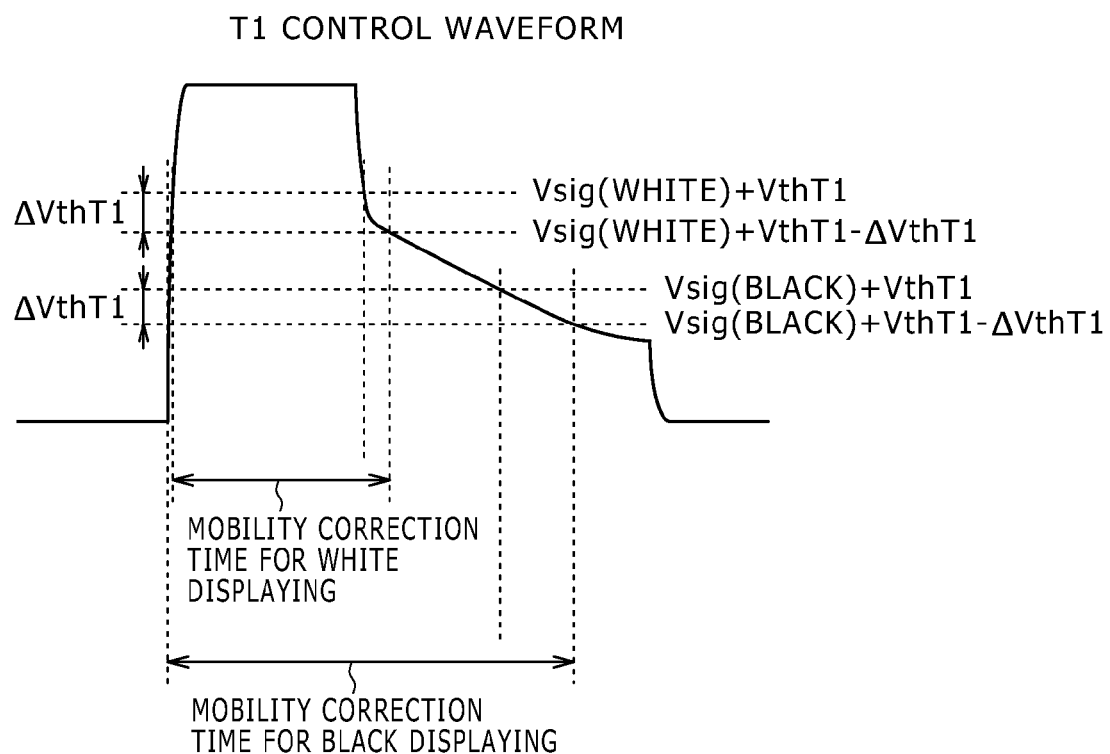
FIG. 20 is a waveform diagram for explaining the problem of the reference example shown in FIG. 19.

If the threshold voltage of the sampling transistor T1 is shifted toward the negative side, the mobility correction times for white displaying and black displaying are extended corresponding to the shift of the threshold voltage as shown in FIG. 20. This effect significantly appears particularly on the falling edge side, where the control waveform of the sampling transistor T1 is distorted. As described above, at the time of white displaying, the mobility correction time itself is short and the current supplied from the power supply is large. Therefore, if the mobility correction time is extended even slightly, the source potential of the drive transistor T2 greatly rises up and the current flowing to the light-emitting element EL becomes smaller. Accordingly, the light-emission luminance decreases with time elapse and image quality defects such as streaks and unevenness occur. The falling edge of the control pulse of the sampling transistor T1 is distorted as shown in FIG. 15. Thus, even a slight amount of change in the threshold voltage leads to a large amount of change in the turning-off timing, resulting in a large amount of change in the correction time.

Figure 21:
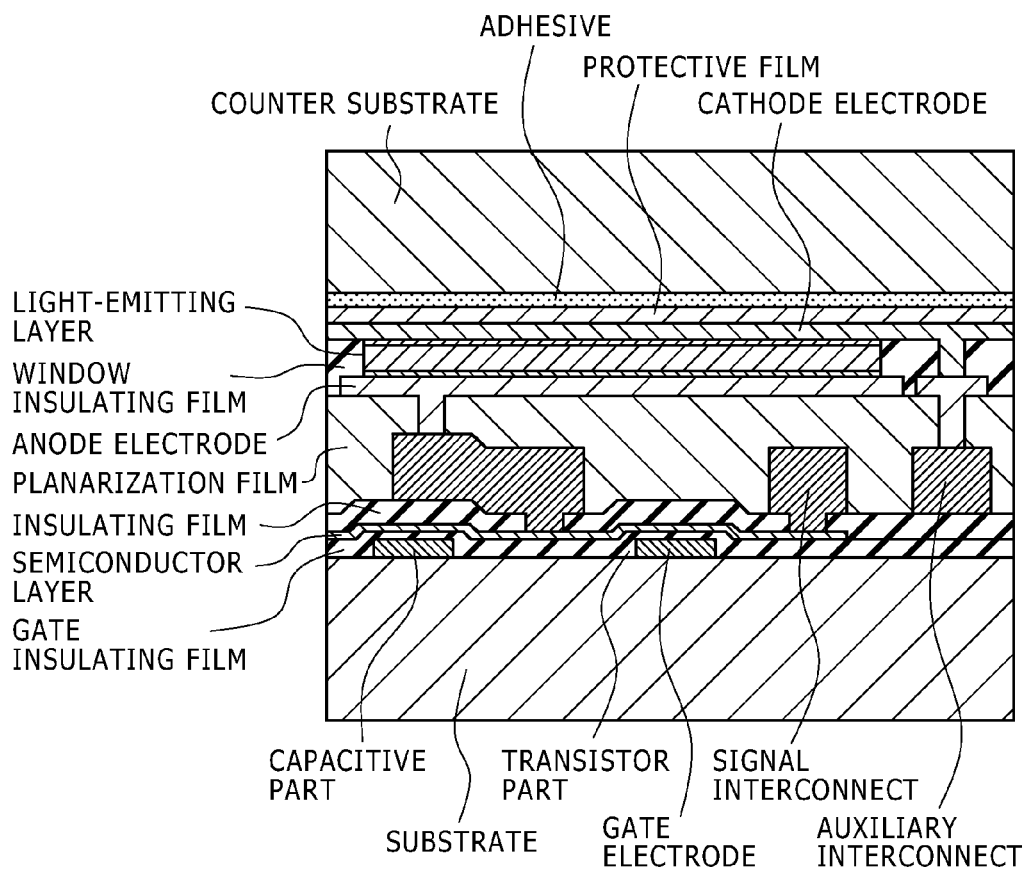
FIG. 21 is a sectional view showing the device structure of the display device according to the embodiments of the present invention.

The display device according to the embodiments of the present invention has a thin film device structure like that shown in FIG. 21. This diagram shows the schematic sectional structure of a pixel formed over an insulating substrate. As shown in the diagram, the pixel includes a transistor part having plural thin film transistors (only one TFT is shown in the diagram), a capacitive part such as a hold capacitor, and a light-emitting part such as an organic EL element. The transistor part and the capacitive part are formed on the substrate by a TFT process, and the light-emitting part such as an organic EL element is stacked thereon. A transparent counter substrate is attached over the light-emitting part with the intermediary of an adhesive, so that a flat panel is obtained.

Figure 22:
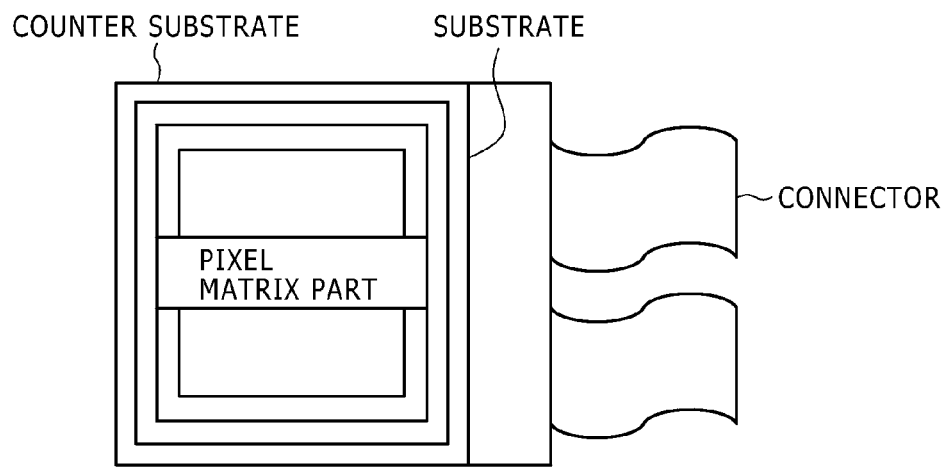
FIG. 22 is a plan view showing the module structure of the display device according to the embodiments of the present invention.

The display device according to the embodiments of the present invention encompasses a display module having a flat module shape like that shown in FIG. 22. For example, this display module is obtained as follows. A pixel array part in which pixels each including an organic EL element, thin film transistors, a thin film capacitor, and so on are integrally formed into a matrix is provided on an insulating substrate. Furthermore, an adhesive is so disposed as to surround this pixel array part (pixel matrix part), and a counter substrate composed of glass or the like is bonded to the substrate. This transparent counter substrate may be provided with e.g. a color filter, a protective film, and a light-blocking film according to need. The display module may be provided with e.g. a flexible printed circuit (FPC) as a connector for input/output of signals and so forth to/from the pixel array part from/to the external.

The display device according to the above-described embodiments of the present invention can be applied to a display (display part) that has a flat panel shape and is included in any of various kinds of electronic apparatus, such as a digital camera, a notebook personal computer, a cellular phone, and a video camcorder. Specifically, the display device can be applied to a display (display part) in electronic apparatus in any field, capable of displaying information input to the main body part of the electronic apparatus or produced in the main body part of the electronic apparatus as an image or video. Examples of electronic apparatus to which such a display device is applied will be described below.

Figure 23:
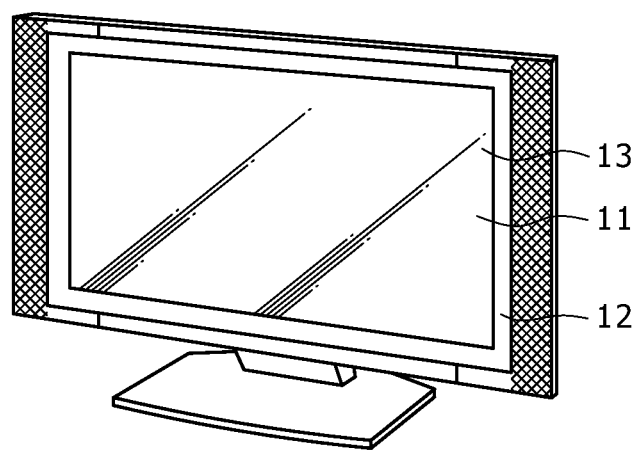
FIG. 23 is a perspective view showing a television set including the display device according to the embodiments of the present invention.

FIG. 23 shows a television to which the embodiments of the present invention are applied. This television includes a video display screen 11 composed of a front panel 12, a filter glass 13, and so on, and is fabricated by using the display device according to the embodiments of the present invention as the video display screen 11.

Figure 24:
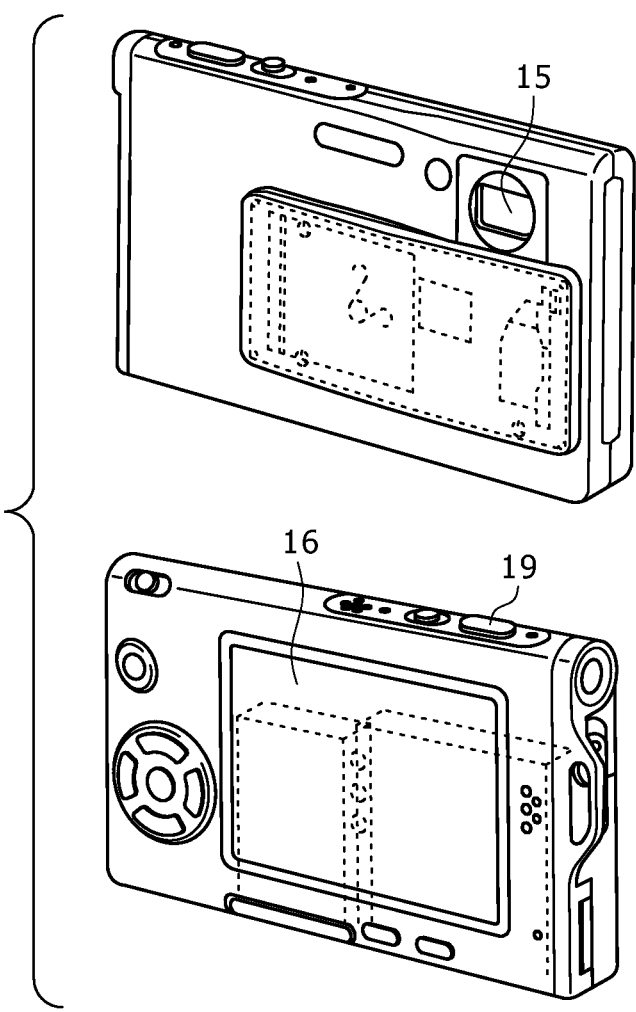
FIG. 24 is a perspective view showing a digital still camera including the display device according to the embodiments of the present invention.

FIG. 24 shows a digital camera to which the embodiments of the present invention are applied: the upper diagram is a front view and the lower diagram is a rear view. This digital camera includes an imaging lens, a light emitter 15 for flash, a display part 16, a control switch, a menu switch, a shutter button 19, and so on, and is fabricated by using the display device according to the embodiments of the present invention as the display part 16.

Figure 25:
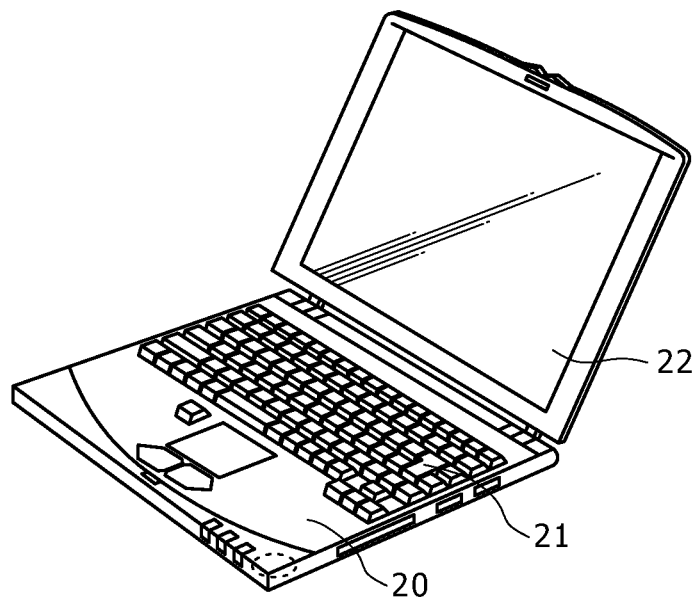
FIG. 25 is a perspective view showing a notebook personal computer including the display device according to the embodiments of the present invention.

FIG. 25 shows a notebook personal computer to which the embodiments of the present invention are applied. A main body 20 thereof includes a keyboard 21 that is operated in input of characters and so on, and the body cover thereof includes a display part 22 for image displaying. This notebook personal computer is fabricated by using the display device according to the embodiments of the present invention as the display part 22.

Figure 26:
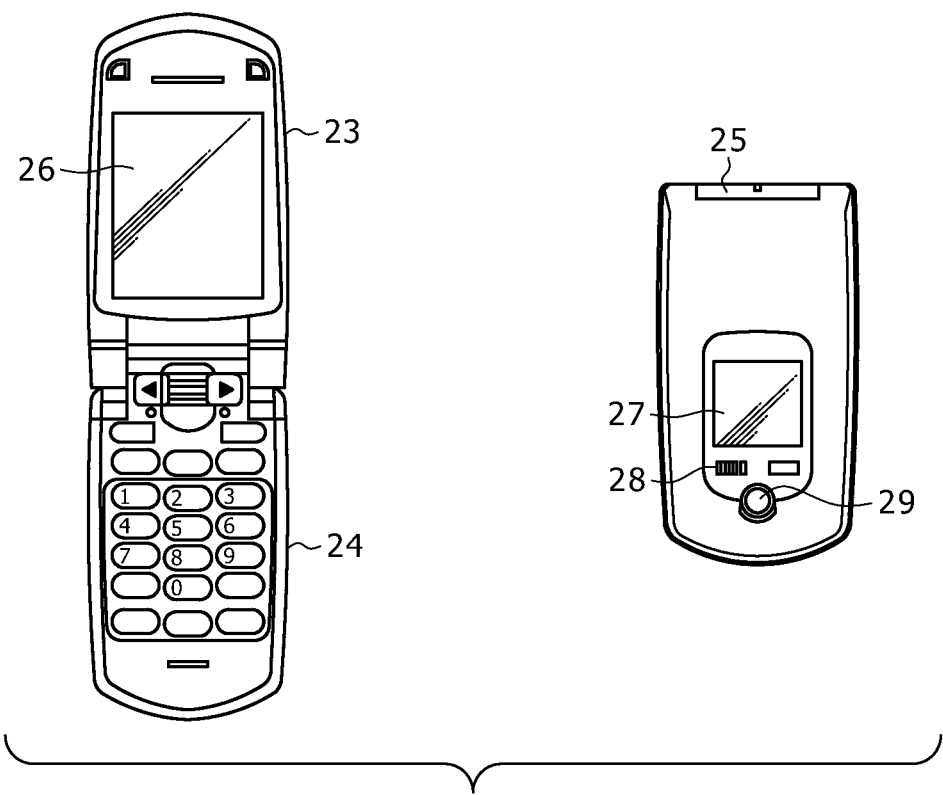
FIG. 26 is a schematic diagram showing portable terminal apparatus including the display device according to the embodiments of the present invention.

FIG. 26 shows portable terminal apparatus to which the embodiments of the present invention are applied: the left diagram shows the opened state and the right diagram shows the closed state. This portable terminal apparatus includes an upper casing 23, a lower casing 24, a connection (hinge) 25, a display 26, a sub-display 27, a picture light 28, a camera 29, and so on. This portable terminal apparatus is fabricated by using the display device according to the embodiments of the present invention as the display 26 and the sub-display 27.

Figure 27:
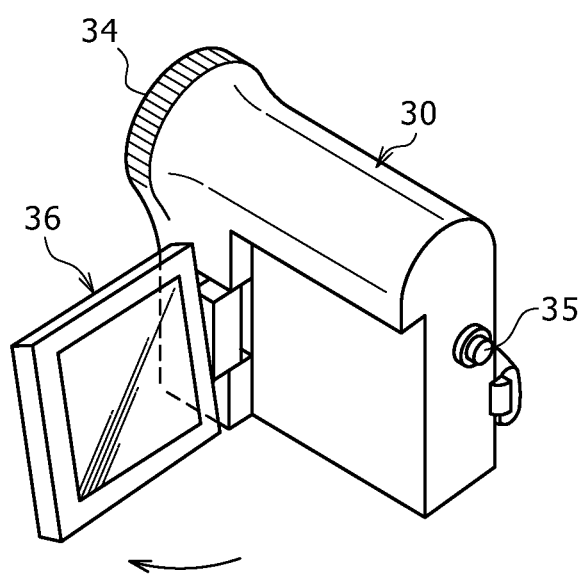
FIG. 27 is a perspective view showing a video camcorder including the display device according to the embodiments of the present invention.
Figure 28:
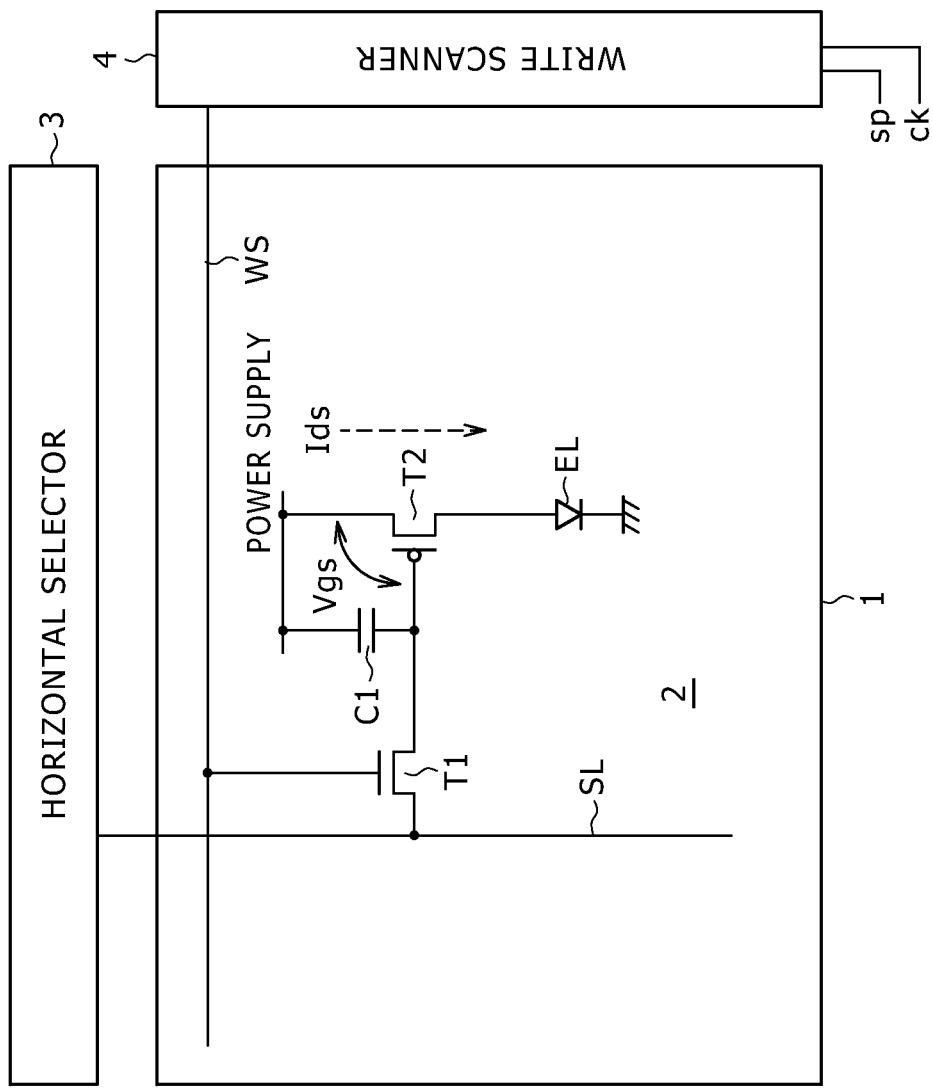
FIG. 28 is a circuit diagram showing one example of a related-art display device.
Figure 29:
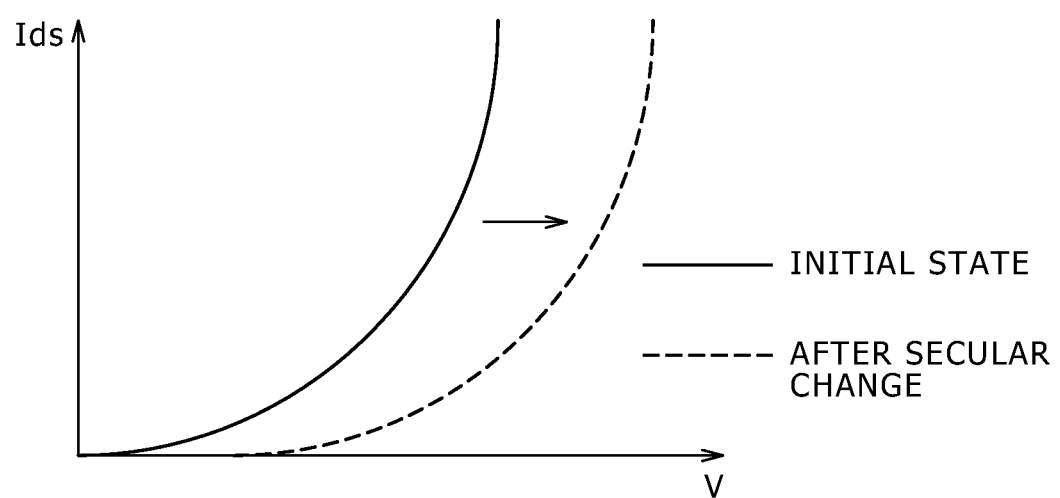
FIG. 29 is a graph showing the current-voltage characteristic of a light-emitting element.

FIG. 27 shows a video camcorder to which the embodiments of the present invention are applied. This video camcorder includes a main body part 30, a lens 34 that is disposed on the front side of the video camcorder and used for subject photographing, a start/stop switch 35 for photographing, a monitor 36, and so on. This video camcorder is fabricated by using the display device according to the embodiments of the present invention as the monitor 36.

The present application contains subject matter related to that disclosed in Japanese Priority Patent Application JP 2008-204940 filed in the Japan Patent Office on Aug. 8, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A display device comprising:
   a plurality of scan lines, a plurality of supply lines, and a plurality of pixels that are arranged in a matrix; and
   wherein at least one of the pixels includes a first transistor, a second transistor, a hold capacitor, and a light emitting element,
   the first transistor has a gate connected to one of the scan lines and is connected between one of the supply lines and a gate of the second transistor,
   the second transistor is connected between a power supply and the light-emitting element,
   the hold capacitor holds a voltage corresponding to a supply line voltage provided from the supply line,
   the first transistor being kept at an on-state during a period shorter than one horizontal cycle,
   the first transistor having a double gate structure, and
   the second transistor causing a drive current dependent on the voltage to flow to the light-emitting element for light emission.

2. The display device according to claim 1, wherein the double gate structure of the first transistor includes a pair of transistor elements that are connected in series between the supply line and the gate of the drive transistor, and gates of the pair of transistor elements are connected in common.

3. The display device according to claim 2, wherein in the first transistor, a capacitor is formed between the gate of the first transistor and an intermediate node that interconnects the pair of transistor elements.

4. The display device according to claim 3, wherein a film thickness of an insulating film that forms the capacitor is larger than a film thickness of an insulating film between the gates of the pair of transistor elements and channels of the pair of transistor elements.

5. The display device according to claim 2, wherein channel regions of the pair of transistor elements are covered by a metal that is formed on an opposite side to the gates of the pair of transistor elements with intermediary of channels of the pair of transistor elements and is at the same potential as potential of the gates of the pair of transistor elements.

6. The display device according to claim 2, wherein the pair of transistor elements are different from each other in channel length.

7. The display device according to claim 2, wherein of the pair of transistor elements, the transistor element closer to the supply line has a channel length larger than a channel length of the transistor element closer to the gate of the drive transistor.

8. The display device according to claim 6, wherein the pair of transistor elements have the same channel width.

9. An electronic apparatus including the display device of claim 1.

10. The electronic apparatus according to claim 9, wherein the double gate structure of the first transistor includes a pair of transistor elements that are connected in series between the supply line and the gate of the drive transistor, and gates of the pair of transistor elements are connected in common.

11. The electronic apparatus according to claim 10, wherein in the first transistor, a capacitor is formed between the gate of the first transistor and an intermediate node that interconnects the pair of transistor elements.

12. The electronic apparatus according to claim 11, wherein a film thickness of an insulating film that forms the capacitor is larger than a film thickness of an insulating film between the gates of the pair of transistor elements and channels of the pair of transistor elements.

13. The electronic apparatus according to claim 10, wherein channel regions of the pair of transistor elements are covered by a metal that is formed on an opposite side to the gates of the pair of transistor elements with intermediary of channels of the pair of transistor elements and is at the same potential as potential of the gates of the pair of transistor elements.

14. The electronic apparatus according to claim 10, wherein the pair of transistor elements are different from each other in channel length.

15. The electronic apparatus according to claim 10, wherein of the pair of transistor elements, the transistor element closer to the supply line has a channel length larger than a channel length of the transistor element closer to the gate of the drive transistor.

16. The electronic apparatus according to claim 15, wherein the pair of transistor elements have the same channel width.

* * * * *